(12) United States Patent  
Brooks et al.

(10) Patent No.: US 7,701,808 B2  
(45) Date of Patent: Apr. 20, 2010

(54) ENHANCED DATA STORAGE AND RETRIEVAL DEVICES AND SYSTEMS AND METHODS FOR UTILIZING THE SAME

(75) Inventors: Juliana H. J. Brooks, North East, MD (US); Mark G. Mortenson, North East, MD (US)

(73) Assignee: GR Intellectual Reserve, LLC, Havre de Grace, MD (US)

( * ) Notice: Subject to any disclaimer, the term of this patent is extended or adjusted under 35 U.S.C. 154(b) by 0 days.

(21) Appl. No.: 12/025,413

(22) Filed: Feb. 4, 2008

(65) Prior Publication Data

US 2008/0165634 A1 Jul. 10, 2008

Related U.S. Application Data

(62) Division of application No. 10/467,912, filed as application No. PCT/US02/01418 on Jan. 16, 2002, now Pat. No. 7,352,660.

(51) Int. Cl.  
*G11B 11/00* (2006.01)

(52) U.S. Cl. ............... 369/13.28; 369/13.26; 369/44.37

(58) Field of Classification Search ............. 369/13.28, 369/13.26, 13.25, 284, 121, 116, 94, 103, 369/112.1, 112.15, 59.11, 126, 53.35, 44.11, 369/44.37, 47.1  
See application file for complete search history.

(56) References Cited

U.S. PATENT DOCUMENTS

| | | | | |
|---|---|---|---|---|
| 4,660,187 A | * | 4/1987 | Yoshino et al. | 369/13.28 |
| 6,269,066 B1 | * | 7/2001 | Chase | 369/126 |
| 6,744,717 B2 | * | 6/2004 | Ichihara et al. | 369/53.35 |

* cited by examiner

*Primary Examiner*—Ali Neyzari  
(74) *Attorney, Agent, or Firm*—Mark G. Mortenson

(57) ABSTRACT

The present invention relates generally to the storage of information on magnetic and/or optical storage media by using one or more novel approaches alone or in combination. These novel approaches are capable of using at least one code which may comprise more than two values (i.e., more than a "0" and a "1"). A first series of approaches for the storage of information applies generally to optical storage/retrieval systems (e.g., CD's, DVD's, etc.); while a second series of approaches applies generally to electric and/or magnetic storage/retrieval systems (e.g., magnetic, magneto-optic, etc.). Each series of approaches is capable of storing information in one or more codes, wherein such approaches permit, if desired, the use of at least one higher order code which is different from the traditional binary code of "0's" and "1's" currently utilized for the storage of digital information. Said at least one higher order code may comprise three or more optical and/or magnetic values or bits that are used to represent, for example, ASCII or Unicode characters that are currently represented predominantly by the traditional binary code. This higher order code may also be an analog or analog-like code.

18 Claims, 22 Drawing Sheets

■ ||  Field
| |  No field
Fig. 14a
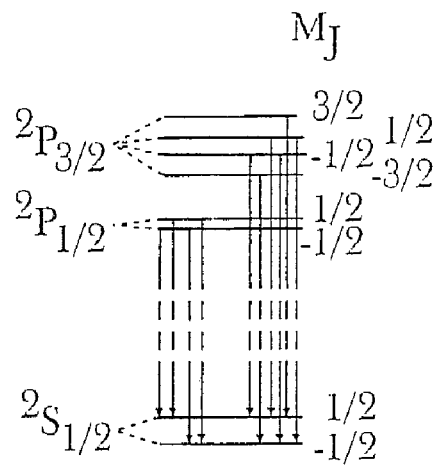
Fig. 14b
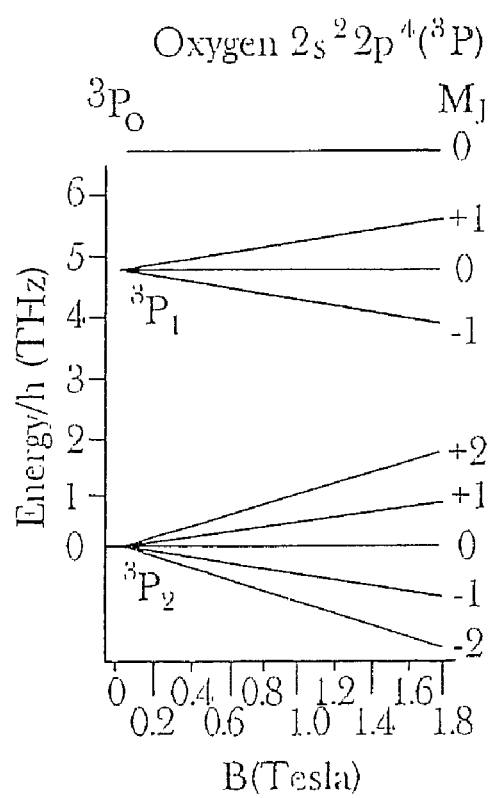
Fig. 15
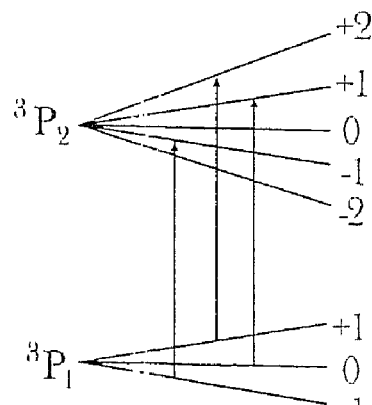
Fig. 16

ENHANCED DATA STORAGE AND RETRIEVAL DEVICES AND SYSTEMS AND METHODS FOR UTILIZING THE SAME

The present application is a divisional of U.S. patent application Ser. No. 10/467,912, hereby expressly incorporated by reference. That application entered the U.S. national phase on Mar. 29, 2004 now U.S. Pat. No. 7,352,660, from International Application No. PCT/US02/01418. The priority date of the International Application is Jan. 16, 2002.

TECHNICAL FIELD

The present invention relates generally to the storage and/or retrieval of information on magnetic and/or optical storage media by using one or more novel approaches alone or in combination. These novel approaches are capable of using at least one code which may comprise more than two values (i.e., more than a "0" and a "1"). A first series of approaches for the storage of information applies generally to existing optical storage/retrieval systems (e.g., CD's, DVD's, etc.) as well as novel optical systems; while a second series of approaches applies generally to existing electric and/or magnetic storage/retrieval systems (e.g., magnetic, magneto-optic, etc.) as well as other novel electrical/magnetic systems. Each series of approaches is capable of storing information in one or more codes, wherein such approaches permit, if desired, the use of at least one higher order code which is different from the traditional binary code of "0's" and "1's" currently utilized for the storage of digital information. Said at least one higher order code may comprise three or more optical and/or magnetic values or bits that are used to represent, for example, ASCII or Unicode characters that are currently represented predominantly by the traditional binary code. This higher order code may also be an analog or analog-like code.

BACKGROUND OF THE INVENTION

Data storage devices have been becoming smaller in size (as well as faster) due to, for example, the continued improvement in the ability to store more information in smaller spaces. For example, over the past twenty years the ability to place more data on magnetic storage media such as magnetized hard-disk drives and/or floppy disks, as well as on optical media (e.g., compact disks "CD's" and more recently, Digital Versatile Disk "DVD's") has been increasing at a phenomenal pace. The impressive increase in the ability to store more data in smaller areas has been one of the main driving forces for rendering computers, and other electronic devices with reasonably sized memories, accessible to a typical home or small business consumer. Further, the high operating speeds of microprocessors have required stored data in computers to be rapidly accessible (e.g., both the rate at which information is delivered to a microprocessor as well as the amount of time it takes between the time that a microprocessor requests a file and when the first piece of data begins to flow from the file to the microprocessor are important). Magnetic memory has undergone many recent improvements and has been utilized extensively in data storage/retrieval devices because magnetic memory currently provides the least expensive alternative for the fast writing and reading capabilities for data. However, the various currently utilized magnetic technologies face a variety of technical challenges and appear to be headed for a stopping point. Specifically, these various approaches for the storage and/or retrieval of information may no longer be capable of meeting the growing demands of the industry, without experiencing significant technical enhancements.

For applications where speed has historically been less important, various optical technologies have been growing in popularity. Many technical advances have been made in the recording and/or retrieval of information by optical means. In systems which use compact disks ("CD's"), compact disk read-only memory ("CD-ROM's") and/or Direct Video Disks ("DVD's"), the storage and/or retrieval of information has also been of great interest. For example, the first CD's manufactured were CD-ROM's that are currently capable of storing about 650 MB of data. This equates to about 74 minutes of play-time for music that has been recorded in a typical recording mode.

In particular, the standard current approach for utilizing CD-ROM's, includes the use of a solid state interrogating laser (or in some cases more than one laser) which has a wavelength of about 780 nanometers (0.78 µm). The standard CD-ROM is about 12 cm in total diameter and has a thickness of about 1.2 mm. The standard CD-ROM has information recorded on plateaus ("bumps") and valleys ("pits") that spiral from the inside of the disk toward the outside of the disk. The digital data stored in the tracks that comprise the spirals must be separated by enough space (e.g., tracks are typically separated radially by about 1.6 µm) so that when the data is read with an interrogating solid state laser, crosstalk from adjacent tracks does not occur (i.e., recorded information is received from only one track at a time). Accordingly, the placement of more information onto a typical CD has been limited by the required size (e.g., length and width) of the plateaus ("bumps") and valleys ("pits"). The size of the plateaus and valleys (e.g., typically not less than 830 nanometers in length) has been a function of various factors, including the wavelength of the laser utilized to read the information from the CD.

Various attempts have been made to increase the memory capacity of current CD's, including the stacking of a plurality of disks one on top of the other so as to provide more memory space, as well as other attempts to miniaturize the digitized information stored in the tracks.

The most recent significant improvements in this type of optical storage/retrieval technology have been the creation of the DVD, which is known as the "Direct Video Disk" or the "Digital Versatile Disk". The first commercial products of DVD's entered the marketplace in late 1997. The DVD technology is similar to the technology in CD's, except that, for example, the wavelength of lasers utilized to read information from DVD's is smaller than that used for CD's, namely, about 635 nanometers or 650 nanometers, compared to about 780 nanometers for CD's. The size of the plateaus ("bumps") that make up the DVD are about 320 nanometers wide, a minimum of about 400 nanometers long and about 120 nanometers thick. About 740 nanometers separate one track from the next, compared to the about 1600 nanometer separation of tracks in CD's. A standard DVD is physically about the same size as a CD, but has a memory capacity that is about seven times greater than that of CD's. In particular, the memory capacity of a one-sided, one-track, DVD is now about 4.7 GB. However, recent improvements in DVD have allowed digital information to be placed on both sides of a single track, as well as both sides of a double track. In this regard, a first interrogating laser reads the digitized data on a first side of a first track (i.e., in the form of bits arranged in a spiral track that begin in the innermost portion of the DVD and spirals outward). Then, information can be retrieved from the opposite side of the first track in a similar manner from a second laser;

however, the spiral track of information typically begins on the outermost portion of the disk and spirals inward toward the center. Accordingly, when dual-track, dual-sided DVD disks are used, the current amount of memory that can be achieved is about 17 GB.

Another optical data storage technique which shows promise is known as holographic memory. The potential for high storage capacity and high storage retrieval rates using the holographic technique is tremendous. In particular, for example, recent work in a system known as Holographic Data Storage System ("HDSS"), has shown that data can be accessed in 100 microseconds or less, which is several orders of magnitude faster than the millisecond retrieval of data in typical magnetic-disk drives. Briefly, in this technology, an optical-interference pattern is created within a desired photosensitive material (e.g., a crystal or a polymer). The optical interference pattern is imprinted as a result of physical changes in such materials. The interference pattern is created by the interaction between an object beam and a reference beam, both of which typically originate from a single light source (e.g., a laser), but are split into two different pathways by a beam splitter. Specifically, the object beam is incident on a target object that contains data, and modifies the object beam, while the reference beam, taking a separate path which leaves it unmodified, interferes with the object beam at the holographic storage medium. When the two beams meet at the holographic storage means, the interference pattern which results from their interaction is stored on or in the holographic storage means. The holographic storage means is later interrogated by a reading or reference beam, which upon interacting with the holographically stored interference pattern, can then recreate the holographic image containing the data originally stored in the object beam.

While the holographic optical technique shows great promise for the future, current industrial emphasis is being placed primarily on improving existing digital optical and magnetic storage/retrieval systems so that, more information can be stored in smaller spaces, and retrieval times can be decreased without significantly changing the basic methodology and hardware for the storing and retrieving of information.

With regard to placing more data onto magnetic recording media, effects such as the paramagnetic effect (e.g., magnetic crosstalk between magnetic domains comprising bits) are already beginning to cause problems. Experts have postulated, that in coming years, magnetic storage technologies could reach a limit imposed by the superparamagnetic effect ("SPE"). The physical phenomenon known as SPE can occur in a magnetic data storage system when the magnetic spins of electrons in the domains which comprise a bit (e.g., in current technology typically either a "0" or a "1") become unstable due to, for example, the environmental thermal energy surrounding the bits. Instability of bits occurs when smaller and smaller numbers of domains or atoms are used to comprise a bit and the ability for the domains or atoms to maintain their given spin directions (e.g., corresponding to, for example, a "0" or a "1") becomes difficult. Non-maintenance of spin directions results in a "flipping" of spins back and forth and thus changing "0's" to "1's" and "1's" to "0's", etc. Such changing or flipping of spins will result in a corruption of the data or information that the "0's" and "1's" represent. Accordingly, in order for smaller numbers of atoms to be used to form a bit and in order for the bit to be viable, techniques and/or materials for preventing the superparamagnetic effect need to be developed to overcome the deficiencies of the prior art.

Another potential problem in recording information magnetically is that the write head which is used to align magnetic domains in the magnetic storage media may be limited in the ability to impart a required field strength over the entire domain area comprising a bit to cause the magnetic domains to behave as though they have been exposed to a substantially uniform field. In such cases, it is possible that differently oriented, domains within a bit (e.g., differently oriented due to being subjected to different magnetic field strengths within a single writing head due to, for example, non-uniformity of the magnetic flux lines emanating from the write head and/or differently oriented because some domains require more energy than other domains to align due to, for example, their location within a bit) may have a higher tendency to become corrupted, as well as adding to signal/noise ratio problems.

One attempt for miniaturizing domains involves the use of so-called "hard" magnetic materials. The use of hard magnetic materials is desirable when compared to "soft" magnetic materials because hard magnetic materials are more likely to maintain their magnetic spin directions when domains comprising the hard magnetic materials are closely spaced. In this regard, various rare-earth and transition, elements have been found to be magnetically stable and are thus termed "hard". Such magnetically stable materials are known to have a higher coercivity, which is typically represented by "$H_c$". Stated in an over simplified manner, the higher the $H_c$ value, the greater the resistance of the material to outside influences, such as outside magnetic fields (e.g., the harder it is for material to lose its imprinted spin direction due to an increase in temperature and/or the influence of other magnetic fields, etc.). However, one drawback for utilizing "hard" magnetic materials is that hard magnetic materials are more difficult to magnetize than soil magnetic materials (e.g., in some cases, depending on the particular materials chosen, much more difficult to magnetize). This makes it more difficult to record data initially in hard magnetic materials. There are various known approaches for solving the problem of encoding data into hard magnetic materials which approaches utilize a laser in conjunction with an appropriate magnetic write head. These various approaches have been referred to generally as the "magneto-optical" approach. These magneto-optical approaches effectively reduce the $H_c$ value of the magnetic domains by causing the domains to be locally heated just prior to being subjected to the magnetic write head. Thus, the coercivity ($H_c$) of the domains is effectively reduced and when such effective reduction in $H_c$ has occurred, a somewhat standard write head, or in some cases a very different write head, can be used to alter favorably the magnetic domains. In other words, the use of a laser, which provides thermal energy to the domains of the hard magnetic material, causes the hard magnetic material to behave in a manner which is similar to a somewhat softer and thus easier to magnetize magnetic material.

Each of the known approaches for utilizing the magneto-optic techniques involves the use of at least one laser and/or at least one laser focusing system. However, one of the common problems facing these magneto-optical approaches is that the lasers that are utilized to soften the hard magnetic material prior to subjecting the hard magnetic material to a magnetic field is that the lasers typically generate excess amounts of heat that can flow to neighboring bits or tracks (e.g., thermal energy is caused to migrate to undesirable neighboring tracks or areas resulting in a potential corruption of stored information). Accordingly, various laser applications and/or storage solutions have been devised to minimize the transfer of heat from the laser to neighboring tracks, and thus minimize the loss of recorded information. However, to date tins thermal transfer of laser energy still presents problems to varying degrees in all the prior art approaches.

One interesting technique for the reading of data in connection with one optical-magnetic system is the use of an effect known as the "Kerr effect", and more particularly, the "magneto-optical Kerr effect". Briefly, current uses of the magneto-optical Kerr effect involve incident polarized light being reflected from the surface of a magnetic domain in different ways, depending on the orientation of the magnetic domains (e.g., depending on electron spin directions). The changes in the reflected polarized light are made, by algorithms, to correspond to different digitized data. Specifically, when the incident polarized light encounters different magnetic field orientations (e.g., north or south domains comprising a bit which are ordered to represent either a "0" or a "1") the polarization state of the reflected light is changed.

Another approach to the digital storage of information that shows future promise is known as atomic resolution storage ("ARS"). This approach, similar to holographic techniques, is capable of storing tremendous amounts of information in a small amount of space. In this technique, generally, very small electron probes, which are used to generate electron beams, are formed into an array. The electron probes have tips that are roughly the size of atoms. The electron beams from the electron probes are made to be incident upon a storage medium so that the incident beams cause some sort of physical change in the storage medium (i.e., the medium comprising the computer memory). One example of such a storage medium is a material that is capable of containing at least two stable phases at ambient operating conditions so that an incident electron beam emitted from an electron probe changes the storage material from one phase to the other. In this technique, encoded bits of information are represented by the change in phase of the phase-change storage material. This technique, similar to the magneto-optical technique discussed above, also suffers from the problem of heat flowing between data spots created by the incident electron beams when the spots or bits are initially recorded. Accordingly, one of the challenges faced by this relatively new technology includes reducing the (low of heat between data spots which are created by the array of electron beam generators.

The retrieval of stored information is also a challenge. In this regard, as bits become smaller and include lesser numbers of magnetic domains per bit and/or the domains are oriented differently, (e.g., domains are aligned perpendicular to the substrate containing at least one magnetic surface thereon instead of being parallel to the substrate surface) such bits are capable of being packed more tightly together. Assuming that the bits are not corrupted by their tight packing and/or smaller numbers of magnetic domains and/or non-uniform alignment within a bit, then reading of these tighter packed domains comprising the bits also becomes a challenge which the prior art is still struggling to overcome. Historically, large numbers of magnetic domains were present in each bit which contained digital data. Thus, the resulting or induced magnetic fields were relatively large and various forms of known inductive reading techniques were sufficient to ascertain whether the hundreds or thousands of aligned domains in a bit corresponded to a "0" or a "1". However, as prior art miniaturization recording techniques progressed, the known inductive reading techniques were typically not sensitive enough to determine accurately the alignment of ever decreasing numbers of domains comprising a bit (e.g., signal to noise problems in the storage and/or retrieval of digital data bits were exacerbated).

The development of magnetoresistive heads, and the subsequent development of giant magnetoresistive heads, has enabled smaller numbers of domains comprising a digital bit to be read accurately. In both of magnetoresistive and giant magnetoresistive heads, the electrical resistance of one or more materials comprising the read head(s) is examined. In particular, both magnetoresistive and giant magnetoresistive heads are made from materials that exhibit small changes in their electrical resistance as a function of magnetic fields created by oriented domains to which such heads are exposed. Giant magnetoresistive heads are two or three times more sensitive than magnetoresistive heads due to their novel structure which includes layering of different materials stacked on top of each other. One problem that continues in these technologies is the presence of magnetization vortices in the recorded domains. Such vortices may result from the difficulty in achieving uniform domain alignment within a bit due to, for example, the difficulty in applying a required magnetic field (e.g., uniform field) to the domains during the recording or writing process.

While use of the magneto-optical Kerr effect and new read heads such as magnetoresistive heads and giant magnetoresistive heads have improved digital data retrieval techniques, further miniaturization is pushing the limits of these systems. Accordingly, additional improvements are necessary in the ability for hardware, combined with suitable programming, to detect even smaller numbers and/or smaller sizes of domains comprising digitized (or analog) data bits. Thus, additional innovations in the detection of stored data are required.

In addition to the storage of information digitally, the possibility or promise of storing information in an analog manner continues to intrigue various investigators. While certain improvements have been made in, for example, the processing of analog information (e.g., the advent of VLSI (Very Large Scale Interrogation) chips, the techniques for the storing of analog information need much improvement. Particularly, while analog computing has been known for several decades, an accurate and fast-paced system for the storage and retrieval of information has continued to elude researchers. In this regard, digital computing has received the greatest amount of attention because of it's relative dependability for the storing and retrieving of information in a "1" or a "0" digitized format. Briefly, digital approaches typically include storing a sampling of the analog information that is to be recorded. The number of samples taken (e.g., such sampling typically occurs in predetermined units of space or time) from the analog source will correspond to the accuracy between the original analog image or sound and the stored digital data (i.e., the more digital samples that are recorded of an original analog image or sound, the more accurate the reproduction of the original analog image or sound will be). These techniques of predetermined quantum amounts of sampling of analog images have been adequate for most digitized applications, however, as the need for more accurate recording and retrieval of information occurs (e.g., in, for example, the fields of computing or determining various engineering and scientific relationships in the following representative areas: gravitational; electrostatic; magnetic; thermal; stress; fluid flow field analysis; wave propagation; image processing; etc.), the availability of computing with more accurate data becomes important. However, the digitization of tighter and and/or smaller sampling amounts from an analog source can result in tremendous amounts of digitized data being stored to represent a small actual amount of analog information. This is one area where analog computing has a distinct advantage compared to digital computing. In particular, an analog computer will store only a single piece of information corresponding to a single sampling area, whereas a digital computer will need to store somewhere between, for example, 8 and 16 bits of data to represent the same single piece of information stored in an analog fashion. The large number of bits required to store digital information corresponds to the requirement to store information in an ASCII or Unicode format. However, in order to escape from the current ASCII or Unicode format, analog storage requires a very large number of different data bits (e.g., data corresponding to much greater numbers than merely "0's" and "1's") to be stored and retrieved. Current prior art techniques have great difficulty in storing and/or reading bits corresponding to anything other than "0's" and "1's", let alone the attendant problems of storing and/or reading, for example, a near infinite number of possibilities (e.g., 1, 2, 3. . . n+1). However, when performing complex calculations, the digital process may result in very slow processing times as well as requiring very large memories. It is for this, as well as other reasons, that analog computing is still very attractive. Thus, while advances in the processing of analog information have been made, reliable techniques for the storage and retrieval of analog information are still being sought without airy good solutions currently existing.

As stated above, with regard to digital computing, much of the recent technical emphasis in data storage and retrieval for both optical and magnetic memory enhancement has been on shrinking more information into smaller areas. The ability to place bits, which are the smallest elements of information used by current digital memory systems, into a binary code format, which is a combination of "0's" or "1's", into a smaller area on, for example, magnetic and/or optical disk storage media (e.g., a disk or a tape) may soon reach a limit. Thus, current technologies for writing and/or reading binary data onto and/or from current storage media will be pushed to the maximum limit. Computer designers are already facing a performance gap whereby processors can process information faster than the information can be retrieved from computer memory.

The majority of the currently proposed approaches for the digital storage of information, suffer from the same problem, namely, that the magnetic and/or optical information which is stored uses a binary code (i.e., a base-2 number system) which is a combination of "0's" and "1's". The predominance of the use of a "binary" code has been due to, for example, difficulty in distinguishing signals (e.g., a "0" or a "1") from background noise. In this regard, many techniques have been proposed which use various hardware, as well as algorithms, which attempt to read accurately the stored information as either a "0" or a "1".

However, certain prior art techniques have been, postulated for utilizing codes other than binary. In particular, U.S. Pat. No. 6,154,432, entitled "Optical Storage System" discloses a holographic system which records information in very small spots and postulates that 10 or more digits may be possible to record on a single bit. Accordingly, this holographic technique discloses codes higher order than binary.

Further, for example U.S. Pat. No. 5,450,363, entitled "Gray Coding for a Multi Level Cell Memory System" discloses the use of a so-called "gray code" approach (also known as "gray scale" by others) for data storage. This approach also uses a system which is higher order than binary. In particular, reference is made to the storage of multiple bits of information in a single memory cell thus creating a multi-level cell.

Still further, U.S. Pat. No. 6,061,005, entitled "Encoding of Data", discloses a method of encoding data on magnetic cards which uses symbology other than binary, such as trinary, quaternary or even higher symbology, for the recording of information.

However, while various techniques have been postulated for systems which use codes higher than binary, none of such codes have been commercially adopted due to, for example, signal to noise ratio problems, etc. In particular, reading errors can occur due to lack of contrast between data values. Such lack of contrast can be caused by random noise (e.g., vibrating inaccurate positioning of recording/reading heads, fidelity loss during recording, etc.) and determinate variations. Accordingly, a need exists for techniques which can be commercially viable which can use codes reliably that are higher order than traditional binary codes for the storage and/or retrieval of information.

A very particular combination of "0's" and "1's" is known as the American Standard Code for Information Exchange (i.e., the ASCII code) which assigns a unique code number between 0 and 127 to each of the 128, 7-bit, binary number characters. Table 1 below shows in table form the current ASCII characters arranged by Hexadecimal digits (i.e., 128 different encoding combinations of groups of seven bits). Reading within the Table from left to right and then down, the first 32 values are codes which correspond to various computer control functions such as line feed, carriage return, etc. The $33^{rd}$ value corresponds to the "space" character. Values 34-48 correspond to symbols and punctuation marks. Values 49-58 correspond to digits, and so on, until reaching value 128, which corresponds to "delete". In addition, each of these values also has a corresponding hexadecimal character. For example, the hexidecimal digit corresponding to the "space" character is "20", while the hexidecimal digit corresponding to the letter "n" is "6E", and so on.

TABLE I

|    | 00  | 01  | 02  | 03  | 04  | 05  | 06  | 07  | 08  | 09  | 0A  | 0B  | 0C | 0D | 0E | 0F  |
|----|-----|-----|-----|-----|-----|-----|-----|-----|-----|-----|-----|-----|----|----|----|-----|
| 00 | NUL | SOH | STX | ETX | EOT | ENQ | ACK | BEL | BS  | TAB | LF  | VT  | FF | CR | SO | SI  |
| 10 | DLE | DC1 | DC2 | DC3 | DC4 | NAK | SYN | ETB | CAN | EM  | SUB | ESC | FS | GS | RS | US  |
| 20 |     | !   | "   | #   | $   | %   | &   | '   | (   | )   | *   | +   | ,  | -  | .  | /   |
| 30 | 0   | 1   | 2   | 3   | 4   | 5   | 6   | 7   | 8   | 9   | :   | ;   | <  | =  | >  | ?   |
| 40 | @   | A   | B   | C   | D   | E   | F   | G   | H   | I   | J   | K   | L  | M  | N  | O   |
| 50 | P   | Q   | R   | S   | T   | U   | V   | W   | X   | Y   | Z   | [   | \  | ]  | ^  | _   |
| 60 |     | a   | b   | c   | d   | e   | f   | g   | h   | i   | j   | k   | l  | m  | n  | o   |
| 70 | p   | q   | r   | s   | t   | u   | v   | w   | x   | y   | z   | {   | \| | }  | ~  | DEL |

These 128 characters are enough characters for North American English to be stored and/or retrieved, but are not enough for many other languages (Note: In ASCII, the eighth bit is unused, and is thus normally set to "0"). To represent more than 128 characters, 8-bit (rather than 7-bit) binary numbers are utilized. For each digit in these eight bits there are two choices for the digit, either "0" or "1". This results in a possibility of an additional 128 characters or a total of 256 different combinations of "0's" and "1's" (i.e., $2^8$). Accordingly, the current data storage approaches utilize these 256 combinations of "0's" and "1's". However, these 8-bit numbers still do not provide enough room for all characters that need to be used in the world (e.g., certain Asian languages have thousands of characters each). In addition, there is no universal agreement in the world on what all the characters should be, whether referring to the 128 characters, or the 256 characters, or any number of characters beyond these.

However, certain approaches for dealing with all the various languages in the world, which collectively contain many thousands of characters, are beginning to utilize something referred to as the "Unicode", which uses a 16-bit character set. In order to adopt something similar to the Unicode, even greater strain will be placed on current memory techniques.

Whether using an 8-bit, 16-bit, or some other approach, all such approaches have been limited primarily to using a binary system of data storage. However, due to: (1) the impending size barrier for the storage of information on, for example, magnetic and/or optical media; (2) the performance gap between how fast a processor can process information versus how fast a processor can access information; and (3) the goal for a universal adoption of a common set of characters throughout the world, a different approach for the storage of information, either by digital or analog approaches, is clearly needed. The present invention satisfies the current and future data storage needs by using different approaches for the storage and/or retrieval of data; and/or different codes that use a code higher than the current "base-2 code".

SUMMARY OF THE INVENTION

It is an object of the invention to provide a means for storing/retrieving digitized information optically.

It is an object of the invention to provide a means for storing/retrieving digitized information magnetically.

It is an object of the invention to provide a means for storing/retrieving analog information optically.

It is an object of the invention to provide a means for storing/retrieving analog information magnetically.

It is an object of the invention to provide a storage/retrieval means for utilizing codes other than binary.

It is an object of the present invention to provide an increased number of characters that can be stored as a single bit of information.

It is an object of the invention to provide the ability to store the 128 ASCII-type characters in a much smaller space than the space that is used in a standard binary code of "0's" and "1's".

It is an object of the invention to provide a means for storing/retrieving codes other than binary.

It is an object of the invention to utilize at least a base-3 optical storing/retrieving system.

It is an object of the invention to utilize a least a base-4 coding storing/retrieving system.

It is an object of the invention to utilize at least a base-6 coding storing/retrieving system.

It is an object of the invention to utilize at least a base-8 coding storing/retrieving system.

It is an object of the invention to utilize at least a base-10 coding storing/retrieving system.

It is an object of the invention to utilize particular aspects of the Zeeman effect in connection with the storage/retrieval of digitized information.

It is an object of the invention to utilize particular aspects of the Zeeman effect in connection with the storage/retrieval of analog information.

It is an object of the invention to utilize different shades or colors of spots or dots in connection the optical storage of digitized information.

It is an object of the current invention to utilize different shades or color or spots or dots in connection with the optical storage of analog information.

It is an object of the invention to utilize either monochromatic or polychromatic light in connection with the optical storage of digital and analog information.

It is an object of the invention to utilize an analog-like approach to the storage of data.

The current process of storing bits, which is the smallest element of information used by current memory systems, uses a binary format of only "0's" and "1's". A bit which is "off" is considered to be "false" or "not set", while a bit that is "on" is considered to be "true" or "set". Historically, because bits could only be one of two values, bits have been combined together into larger units in order to represent more characters or values. "Nibbles" are groups of four bits and "bytes" are groups of eight bits (i.e., two "nibbles"). Bytes are typically what are used to store "characters". "Characters" typically include letters, numbers and/or symbols. For example, the ASCII code uses 128 different encoding combinations to represent:

(i) The letters "A-Z" in both upper and lower case (i.e., values 65-90 and 97-122, respectively);
(ii) Special characters (e.g., "<", ".", "%", "$", "?", etc) (e.g., values 33-47);
(iii) The numbers 0-9 (i.e., values 48-57); and
(iv) Certain control codes used for device control (i.e., values 0-31), To represent more than 128 characters, an eighth bit can be utilized. However, the ability to store a binary code of only "0's" and "1's" limits the ability for information to be miniaturized. For example, to store a single character from the ASCII code, at least seven bits of memory (typically eight bits are currently required because the last bit is usually set to zero) are needed. Table 2 sets forth one example of how a typical computer memory system would store the word "Patent".

TABLE 2

| LETTER | ASCII CHARACTER | BINARY NUMBER | HEXADECIMEL DIGIT OR BYTE | BITS OF MEMORY |
|---|---|---|---|---|
| P = | 80 = | 01010000 | 50 | 8 |
| a = | 97 = | 01100001 | 61 | 8 |
| t = | 116 = | 01110100 | 74 | 8 |
| e = | 101 = | 01100101 | 65 | 8 |
| n = | 110 = | 01101110 | 6E | 8 |
| t = | 116 = | 01110100 | 74 | 8 |

Thus, the letter "P" corresponds to the ASCII character 80, which is represented by the binary code "01010000". The first "0" in the sequence is often referred to as "the last bit" and is typically set to "0" for all ASCII characters. The corresponding hexadecimal digit or byte representation is "50". In order for the computer memory system, to store the letter "P", eight bits must be sent to memory in the order "0-1-0-1-0-0-0-0". Likewise, to store the letter "a", eight bits must be sent to memory in foe order "0-1-1-0-0-0-0-1". Accordingly, 48 bits are used to store the six (6) letter word "Patent". Similarly, when a microprocessor unit accesses the portion of memory containing the set of bits representing the word "Patent", the same number of bits (i.e., 48) or six (6) bytes must be processed by the microprocessor. Clearly, if the word "Patent" could use a smaller amount of memory, less memory capacity would be needed in a computer and/or the rate at which data could be stored and/or retrieved from memory would be enhanced.

In a first aspect of the invention, a coding system that is a higher order system than a binary coding system is utilized for the digitized storage of information. For example, any digital coding system which uses three or more different code characters (i.e., a coding system which operates in "base-3" or greater) will result in a reduction in the number of bits needed to store the same amount of digital information relative to a binary system. Thus, by using a higher order memory system, the possibility of storing more digitized information in a smaller memory area exists. Likewise, the rate of storing and/or retrieving digitized information should also increase due to memory being stored in a physically smaller area. This permits a data retrieval device to function more efficiently. The present invention permits the use of a digitized memory system which is base-3 or greater. Moreover, as more code characters are used (e.g., higher order systems of more than 10 or more than 20 different characters are utilized) the digitized system begins to behave in a manner which is similar to analog systems and can thus be referred to as "analog-like". In other words, as the amount of digital sampling of an analog source increases, the recorded digital signal begins to approach the storage of most features of the analog signal. However, current data storage/retrieval techniques utilize, for example, 8 or 16 bits to store a single piece of analog information, which limits the amount of sampling of an analog source that can be reasonably performed when creating a digital representation of the analog source. Accordingly, the digital data storage/retrieval techniques of the present invention can be vastly superior to current digital techniques which utilize only "0's" and "1's" and are limited to sampling much smaller areas of analog sources than would be desirable in many cases (e.g., for complex computer modeling of numerous events, etc.).

A first embodiment of an alternative memory storage system of the present invention may function in a manner somewhat analogous to the manner in which a Compact Disk (CD) or Digital Versatile Disk (DVD) player functions. Current CD and DVD technologies utilize a rotating disk comprised of a number of layers of different materials. The layers may include, for example, polycarbonate plastic, aluminum and acrylic. The aluminum in the disk includes a series of plateaus and valleys sometimes referred to as "bumps" and "pits", respectively. Laser light is caused to focus upon the bumps (plateaus) and pits (valleys) in the rotating disk. The reflection of the laser from the successive plateaus and valleys corresponds to a data stream (e.g., a binary stream) of information. CD's and DVD's use, for example, 16-bit strings of binary coded data. Specifically, laser light reflects differently from a valley compared to the reflection from a plateau and these different reflective properties of the laser, when reflected from these valleys and plateaus, correspond to the binary code data values of "0" and "1" for each bit.

In one embodiment of the present invention, a similar concept to the CD and DVD is utilized, however, rather than utilizing valleys and plateaus (i.e., bumps and pits) in an aluminum layer embedded in a polycarbonate plastic CD or DVD, the present invention utilizes at least two data values per bit represented by different intensity, colors or color width (e.g., different wavelength or frequency). These data values can be optically created, stored in dots or spots, and optically examined or interrogated (e.g., by known transmission and/or reflection techniques). These optical dots or spots may be of a size which is approximately the same order of magnitude in size as the bumps and pits which comprise current data tracks used on CD's and DVD's, they may be larger, or they may be smaller. In particular, similar to current CD's and DVD's, these dots or spots can be put together to form strings or tracks of data which begin at an innermost portion of a rotatable CD/DVD disk and extend spirally out therefrom in the form of tracks. Accordingly, current CD's of approximately 12 centimeters in diameter would be an acceptable size. However, if the dots or spots of the present invention are smaller than the "bumps" of the current technology, it is possible for CD's to be smaller in size, if desired, or more data can be placed into the same amount of memory space. Thus, it is possible to put an amount of optical information onto a rotatable disk of approximately 12 centimeters in diameter which exceeds that amount of information which is currently stored on CD's/DVD's. However, it is possible for the dots or spots to be larger in size than current bumps and pits in CD's/DVD's while still storing more information relative to standard CD's/DVD's. This is possible due to at least two effects. First, tracks may be capable of being located closer together due to, for example, lesser amounts of crosstalk between bits (e.g., recording and or reading operations can take place in a lesser amount of space). Second, if digital codes higher than binary are adopted, less actual bits need to be stored relative to a binary system (e.g., rather than storing 8 or 16 bits to represent a single piece of information, a lesser number of bits can be used to represent the same piece of information that is being stored). It should be noted that as the number of characters that can be stored in a single bit become larger, the digital storage system actually approaches behaviors similar to an analog storage system and can be referred to as "analog-like".

In particular, the present invention is capable of utilizing a coding system other than the binary coding system of "0's" and "1's" now used in CD/DVD systems. For example, a series or range of dots or spots of different color intensities (e.g., white-gray-black), and/or different colors (e.g., red-yellow-violet), and/or both as in varied intensity of polychromatic light, can be placed upon a surface (or embedded somewhere within a material), such as a suitable photoferroelectric material such as "PLZT" (i.e., lead lanthanum zirconate titanate ceramic), which is shaped in the form of, for example, a disk. When, for example, such a disk containing these different intensity data value dots or spots is rotated and interrogated by, for example, a known optical system (e.g., a laser system) with a suitable focusing lens and intensity detecting means (e.g., a suitable photosensitive material or photodiode), the different intensities of the dots or spots can be registered and can be coded to correspond to different values (e.g., "0", "1", "2", "3", etc.). Thus, rather than using a simple binary or base-2 system where a black dot corresponds to "0" and a white dot corresponds to "1", the present invention provides for a larger number of options for digitized data storage. However, as discussed in more detail herein, depending on the sensitivity of the system, this technique could also be used for actual analog computing. Accordingly, for example, in a simple digitized quaternary system having a quaternary code consisting of 0's, 1's, 2's and 3's, there would be 4 different choices of basic digital information storage (i.e., a "base-4" system) rather than only two choices in a binary or base-2 digital system.

Likewise, in a digital system which utilizes 8 different combinations of spots or dots (i.e., a "base-8" system) eight different options exist for encoding a piece of information rather than only two options in a standard binary or base-2 digital system. The use of a larger number of possibilities other than "0's" and "1's" (e.g., 0, 1, 2, 3, 4, 5, 6, 7, etc.) render it possible to store a much greater amount of information in a much smaller physical area due to the elimination of unneeded bit space. Moreover, as the number of possibilities other than "0's" and "1's" increases, (e.g., systems greater than base-10 such as base-20 or greater systems) the closer the digital system comes to being or performing like an analog system, which has certain advantages over digital systems.

An apparatus according to the present invention permits suitable optical data to be stored onto an appropriately constructed and shaped optical recording medium by using, for example, a laser light source. The optical recording media (e.g., a PLZT ceramic) can be in the form of a tape, disk, or credit card or any other acceptable shape. Alternatively, a photodiode or photodiode assembly can also be used. In all such cases, a light source (e.g., laser light source) can be used in combination with, for example, various means for controlling the direction, polarization, intensity and/or final color of the light source. Various examples of such systems include the following: (1) a rotatable polarizing filter (or set of filters), sometimes referred to as an analyzer, used in combination with a suitable light source which is subjected to a first polarizing filter(s) selectively modifying the polarized light from the light source. Specifically, once monochromatic or polychromatic light has been polarized into a first direction polarizer the polarized light is directed toward a second polarizer (sometimes referred to as an "analyzer") which, when rotated, results in, for example, different intensities of light being emitted therefrom. The different intensities of light can be caused to be incident upon at appropriate recording/detecting means; (2) a light source (e.g., a laser light source), which is used in conjunction with a first polarizing filter is caused to be incident on a suitable light diffractor (e.g., a Bragg modulator) which can cause the polarized light from the light source to communicate with one or more of a series of additional polarizing filters (or analyzers) each of which analyzers are rotated, relative to the polarized source, at different angles, thus resulting in different amounts or intensities of light passing through each of the analyzers. Thus, by selectively transmitting the polarized light through the different analyzers (e.g., directed by, for example, the Bragg modulator) different intensities of light can be achieved. Such different intensities can be recorded and/or detected by a suitable means; (3) a light source (e.g., a laser light source) used in combination with an acousto-optic Bragg modulator, whereby different driving signals are input to the Bragg modulator which results in different intensities of light being emitted from the Bragg modulator. The multiple intensity emissions are then directed to a suitable detecting/recording means and are made to correspond to various data points in base-2 or higher order digital data storage systems; and (4) rather than utilizing polarizing filters to polarize a monochromatic or polychromatic source of light, liquid crystal cells can also be utilized. In particular, light can be caused to be incident upon a liquid crystal cell. Depending upon whether voltage is applied to the liquid crystal cell, the output from the liquid crystal cell is oriented into one direction or another. Liquid crystals of this type can be made of, for example, lithium niobate. However, similar to the embodiments (1)-(3) discussed above, intensities can be varied due to relative polarization directions. The outputs of light from the liquid crystal cell can be directed, by appropriate beam displacers (e.g., a Bragg modulator), toward a suitable recording/detecting means.

In each of the examples (1)-(3) discussed above, it is possible that a polychromatic light source could be utilized. In this regard, when polychromatic light is made to be incident upon a first polarizer, and thereafter upon one or more additional polarizers (e.g., analyzers), in addition to different intensities of light flowing through the analyzer(s), a spreading of these different intensities over a particular frequency or wavelength range will also occur. Specifically, when using polychromatic light, a spectrum of frequencies of various intensities results in the formation of a somewhat continuous curve of varying light intensities over a particular frequency or wavelength range. The use of a polychromatic source can therefore result in secondary indicia for determining the value assigned to stored bits of data (e.g., a "0" or a "1") and thus enhances data storage. For example, not only could the highest intensity of light be recorded/detected, but also the starting and/or ending points which correspond to the lowest frequency intensity of light being emitted, and the highest frequency of light being emitted, respectively, or, alternatively, the area under each curve could also be compared. In other words, more than one piece of information can be checked to verify the accuracy of each data point that is stored and read. The presence of more than a single piece of information can result in more accurate reading of data and thus result in signal/noise improvements.

In each of the examples (1)-(4) discussed above, the different intensities or colors of light can be made to be incident upon an appropriate receiving/recording means (e.g., an optical storage means, such as a photopolymerisable/photocrosslinkable material, a photodiode assembly, etc.), such output light being suitably focused onto the appropriate receiving/recording means by known lens or optical systems etc., all of which are discussed in greater detail herein).

Suitable materials for recording various intensities or colors of light include the following materials: inorganic photochromic crystals, photorefractive materials, chalcogenide semiconductors, organic and polymer materials, thermoplastic media, reversible recording in Tellerium compounds, photothermal recording in Antimony compounds, magneto-optic recording and light stimulated recombination luminescence.

For example, in the simplest embodiment (i.e., that embodiment numbered "(1)" above) for understanding the basic concept for recording various intensities of light (even though this simple embodiment is not as commercially significant as the other embodiments discussed herein), each such recorded intensity corresponds to a different value for a digitized data bit. In this basic case, different intensities can be achieved as follows: a polarized light source, such as a laser and polarized filter or polarizer, when used in combination with at least one rotatable polarizing filter (e.g., an analyzer) can result in light of different intensities being transmitted from the at least one rotatable analyzer. Specifically, when the laser light source is passed through a first polarizing filter and a second polarizer (e.g., an analyzer) is sequentially rotated (e.g., from 0-90°) a predetermined amount each time relative to the first polarizing filter (i.e., either the first or second filter can be rotated), different intensity dots or spots corresponding to data values having different meanings (e.g., "0", "1", "2", etc.) can be produced. The amount of rotation of the analyzer in relation to the polarizing filter can correspond to a different intensity of light being recorded on a suitable optical recording medium (e.g., a photoferroelectric material such as "PLZT", inorganic photochromic crystals, photorefractive materials, chalcogenide semiconductors, organic and polymer materials, thermoplastic media, reversible recording in Tellerium compounds, photothermal recording in Antimony compounds, magneto-optic recording and light stimulated recombination luminescence). If a photoferroelectric material is utilized, the different intensities of light can be caused to be incident upon the photoferroelectric material by use of, for example, a suitable optic lens system or a fiberoptic cable (or a series of cables) that is capable of accurately directing the optical signal to the photoferroelectric material for the proper recording of the various optical signals. Thus, a large number of different intensity spots or dots corresponding to data values for a single bit can be created. This basic system and apparatus permits higher order coding systems (e.g., base-3 or greater) to be utilized. The manner in which such optical data is stored, on, for example, a rotatable disk, as well as interrogated, can be by techniques which are substantially parallel, and/or use hardware which is similar, to those techniques and/or hardware currently used in CD and DVD systems. For example, a series of bits of an appropriate binary or higher order digital code system can be recorded onto a rotatable disk by starting to record the different intensity dots or spots near a central potion of the disk. The recording continues to record data in a spiral manner to form tracks of data, such data being suitably separated, physically, to avoid corruption and crosstalk, until an outermost radial portion of the disk is encountered. Likewise, such a disk can be read or interrogated by, for example, a laser system which focuses light onto the dots or spots and suitably measures the intensities (e.g., reflectance or transmittance) of the spots of data. The different intensities can be interpreted by suitable algorithms and programs to correspond to different values in the desired coding system.

Moreover, by utilizing a digital optical coding technique other than binary, the present invention permits a much more rapid adoption of the desired "Unicode", which takes into account, for example, all English language characters, Chinese characters, numbers and symbols, etc., in various digitized forms.

In another embodiment of the invention, a system which utilizes magnetic memory in combination with a suitable retrieval/reading means is utilized. These memory/retrieval systems can be caused to function, generally, in a manner that is somewhat similar to current magnetic memory systems (e.g., magnetic tapes, cards, disks, hard drives, etc.). In addition, these memory systems can also use digital coding/reading systems higher than a base-2 system, if desired. Still further, these memory systems can also store/retrieve information in an analog or analog-like format.

Specifically, it is another object of the invention to utilize certain aspects of the phenomena known as the Zeeman effects to result in a means for the storage and retrieval of information onto/from suitable magnetic media. The term "Zeeman effects", as used herein, denotes the effects of external magnetic fields on frequencies of atoms, molecules and components thereof, in the broadest sense. Thus, as used herein, the term "Zeeman effect" includes not only what may be considered to be Zeeman effects in the more narrow, classical sense but also other magnetic effects such as magnetic quadropole effects, etc. Digital data may be stored as either a binary code or some higher order code that is greater than the binary or "base-2" code. Moreover, due to the apparent sensitivities of these data storage techniques, data may be stored/retrieved in an analog or analog-like manner due to the inherent operation of the Zeeman effects. Specifically, without wishing to be bound by any particular theory or explanation, it appears that use of the Zeeman effects can result in a somewhat continuous set of differing data values that can be stored/retrieved.

The present invention utilizes one aspect of the Zeeman effects in the following general manner. A magnetic field is applied to a suitable media that is capable of receiving and storing at least a portion of the applied magnetic field. One example of such a suitable magnetic material is a ferromagnetic material that is capable of exhibiting different amounts of magnetic domain alignment as a function of increasing magnetic field strength up to its natural magnetic saturation point (i.e., whereby any further increases in applied magnetic field do not result in any measurable further alignment of magnetic domains). Various known materials exist that meet this basic criteria, including many materials currently utilized in the magnetic storage industry (e.g., gamma $Fe_2O_3$, gamma $Fe_2O_3$ modified by Co, $CrO_2$, etc.). The various materials can be held together by a variety of organic polymers including, for example, vinyl chloride, polyvinylchloride, methylacrylate, polymethyl methylacrylate, polyurethane, epoxy, polyamides, etc. Suitable substrates include typical polyesters for flexible materials and aluminum for rigid materials. The differing amounts of stored magnetic field can result in a corresponding splitting or shifting of the electromagnetic energy frequencies or spectral frequencies (e.g., fine spectrum splitting, hyperfine spectrum splitting, vibrational spectrum splitting, etc.) of one or more atoms or molecules of the magnetic material itself, or similar splitting or shifting in one or more materials that are located contiguous (e.g., in the magnetic material or in a read/write head) to the material containing the stored magnetic fields. In the Zeeman effect, the amount of splitting or shifting of one or more frequency spectrum(s) is a function of the strength of the applied/stored magnetic fields. Typically, the higher the magnetic field strength that is stored/applied (e.g., stored in a first material containing magnetic domains and thereafter applied to (e.g., influencing) a second contiguous material that exhibits Zeeman splitting at the stored magnetic field strengths), the further apart the splitting or shifting will be of one or more of the electromagnetic energy frequencies of a chosen spectrum of the targeted atom(s) or molecule(s).

In this Zeeman effect, when a relatively wide splitting of electromagnetic energy frequencies occurs due to the applied magnetic field, the amount of splitting may correspond to frequencies in the microwave region; whereas a narrow splitting will typically correspond to lower frequencies (e.g., radio). The amount of splitting that occurs is important because in order to determine the amount of splitting that has occurred, a suitable interrogating electromagnetic energy is caused to be incident upon, for example, the magnetic material itself or the aforementioned contiguous material. The contiguous material that exhibits Zeeman splitting at the stored magnetic field can be present as, for example, one or more separate sheets of material that are located adjacent to, and/or contiguous with, the material that contains the stored magnetic field. When multiple contiguous materials are utilized, the present invention contemplates the use of a comparative analysis of the differences in Zeeman splitting between two or more such contiguous materials. Alternatively, a material comprising, for example, one or more material(s) that are mixed with the magnetic material (e.g., a binder which holds together at least a portion of the material that stores the magnetic field) could also be used. More specifically, a particular interrogating frequency, or set or sweep of frequencies, needs to be capable of favorably interacting with one or more of the split, shifted or splitting frequencies which result in the magnetic material, or in an alternative embodiment in one or more of the contiguous material(s), due to the different magnetic fields stored therein. In other words, a first magnetic material is desirably chosen so that an applied magnetic field can be reasonably stored therein. However, it is desirable for the magnetic material to be capable of storing reliably several magnetic fields of different strength (e.g., capable of having varying numbers of magnetic domains align with an ever changing magnetic field and such domains remain frozen or pinned so that they do not change with time) and, for example, in one embodiment of the invention, the contiguous material needs to produce split, shifted and/or splitting frequencies in response to the stored magnetic fields. In this regard, if one or more contiguous material(s) are utilized in connection with the magnetic material(s), the contiguous material(s) needs to exhibit a splitting and/or shifting of one or more frequencies, for example, of its rotational, vibrational, etc., bands (e.g., at the atomic level) and the resultant splitting or shifting that occurs in the contiguous material needs to be detectable by an appropriate interrogating electromagnetic source (discussed in greater detail later herein). Alternatively, a contiguous material does not need to be utilized. In this case, the magnetic material per se, or at least a portion thereof, needs to exhibit desirable and detectable splitting and/or shifting of one or more frequencies at varying stored magnetic strengths. Still further, it should be noted that the contiguous material could actually be located in a suitable read head which, similar to magnetoresistive and giant magnetoresistive heads, is influenced by the magnetic field strengths stored in the magnetic media. However, rather than measuring changes in resistivity in materials comprising the read heads, the splitting or shifting of frequencies will be detected by a suitable technique, discussed elsewhere herein. In this embodiment of the invention, the contiguous material may be a solid, a liquid, a gas or plasma (e.g., any material that shows desirable Zeeman splitting effects).

With specific regard to interrogating with an applied electromagnetic source to determine the amount of Zeeman splitting and/or shifting that has occurred at a spot on the material that corresponds to a stored bit of data, at least one suitable frequency can be applied as an interrogating frequency, or, alternatively a sweep or combination of frequencies can be applied as interrogating frequencies. In this regard, if a single suitable frequency is chosen as the interrogating frequency, then heterodyne interactions of the various split, shifted and/or splitting frequencies with the single interrogating frequency can be measured and determined. Alternatively, resonance interactions of the various split, shifted and/or splitting frequencies can also be measured and determined. Each such determined heterodyned and/or resonant frequency can be made to correspond, by suitable programming or algorithmic techniques, to various data values. Alternatively, a series or sweep of frequencies which may resonate with or heterodyne with various split shifted and/or splitting frequencies achieved in the contiguous material can also be utilized. These particular affects will be discussed in much greater detail later herein, however, it should be understood that these data acquisition techniques could be performed using hardware which is somewhat similar to that hardware currently used for magnetoresistive and giant magnetoresistive heads. For example, once an interrogating frequency has been input to a material exhibiting Zeeman splitting and/or shifting, the output (e.g., a heterodyned frequency) can be used as a driving signal or input (e.g., depending on strength or frequency either amplified or unamplified) for various other devices. One example of such other device is an acousto-optic Bragg modulator. In this detection scheme, an appropriate light source is caused to be incident upon an appropriate Bragg modulator. Suitable materials for a Bragg modulator include, for example, lithium niobate crystals and gallium arsenide semiconductor materials. The incident light beam can be caused to be deflected in differing amounts due to different driving signal inputs (e.g., depending on strength or frequency either amplified or unamplified) being directed into the Bragg modulator. In particular, for example, the different heterodyne outputs that correspond to different Zeeman splitting amounts (and thus different data points such as a "0" or a "1") can be input into a Bragg modulator and cause light which is incident on the Bragg modulator to be deflected in different amounts. Thus, the various Zeeman splitting and/or shifting frequencies that are produced can eventually result in different amounts of light deflection due to the use of a Bragg modulator. The amount of deflection of light can be observed by the use of, for example, the light detection devices discussed earlier herein. Similarly, the different heterodyne outputs could be directed into a suitable filter which, due to the different inputs, would regulate the intensity of light passing therethrough. Accordingly, the different intensities of light could then be detected/recorded by a suitable means discussed elsewhere herein.

This particular embodiment of the invention which utilizes differing magnetic fields to result in differing amounts of an appropriate frequency splitting and/or shifting is very suitable to be used for the analog storage/retrieval of information. In particular, a substantial continuum of splitting and shifting frequencies results in most materials that are subjected to a corresponding continuum of changing magnetic field strengths. If a continuum of such differing split, shifted and/or splitting frequencies can be reliably detected, then analog or analog-like (e.g., higher order than binary systems) computing with this technique is facilitated.

Additionally, many of the aforementioned embodiments of the invention can also be used in combination with various holographic and/or three dimensional memory approaches.

To achieve all the foregoing objects and advantages, and to overcome the looming problem in the art of an impending memory barrier, the present invention discloses various means for storing and retrieving information in a digital and/or analog format. With regard to the digital storage of information, a code other than a binary code for the storage of information can be utilized. The result of using a higher order code for digital information storage (i.e., 3 or more characters) is the ability to store more information in the same amount of area or the same amount of information in a smaller area. Accordingly, the present invention provides significant advancement in the art of data storage and/or data retrieval which will assist in preventing the memory barrier from being realized.

BRIEF DESCRIPTION OF THE DRAWINGS

FIG. 12a shows magnification of the curve marked with a single asterisk (*) in FIG. 11 and FIG. 12b shows the magnification of the curve marked with a double asterisk (**) in FIG. 11.

FIG. 14a shows the Zeeman effect for sodium "D" lines; and FIG. 14b shows the energy level diagram for transitions in the Zeeman effect for sodium "D" lines.

FIG. 15 is a graph which shows the splitting of the ground term of the oxygen atom as a function of magnetic field.

FIG. 16 is a graphic which shows the dependence of the Zeeman effect on magnetic field strength for the "3P" state of silicon.

DETAILED DESCRIPTION OF THE PREFERRED EMBODIMENTS

The present invention utilizes new and revolutionary techniques for the storage of data digitally, or in some cases, by analog or, at least a method approaching analog, such storage of data occurring optically, magnetically and/or electrically, magneto-optically and/or combinations thereof. The storage/retrieval methods of the present invention are capable of utilizing traditional binary or base-2 code system approaches as well as non-traditional base-3 and higher order approaches. The use of base-3 and higher order approaches may permit more data to be stored in approximately the same memory area relative to conventional binary techniques and/or substantially the same amount of information is capable of being stored in a smaller area relative to conventional binary techniques.

Certain novel magnetic storage/retrieval techniques will be discussed first, and then followed by discussions of certain novel optical techniques, according to the present invention.

Figure 1:
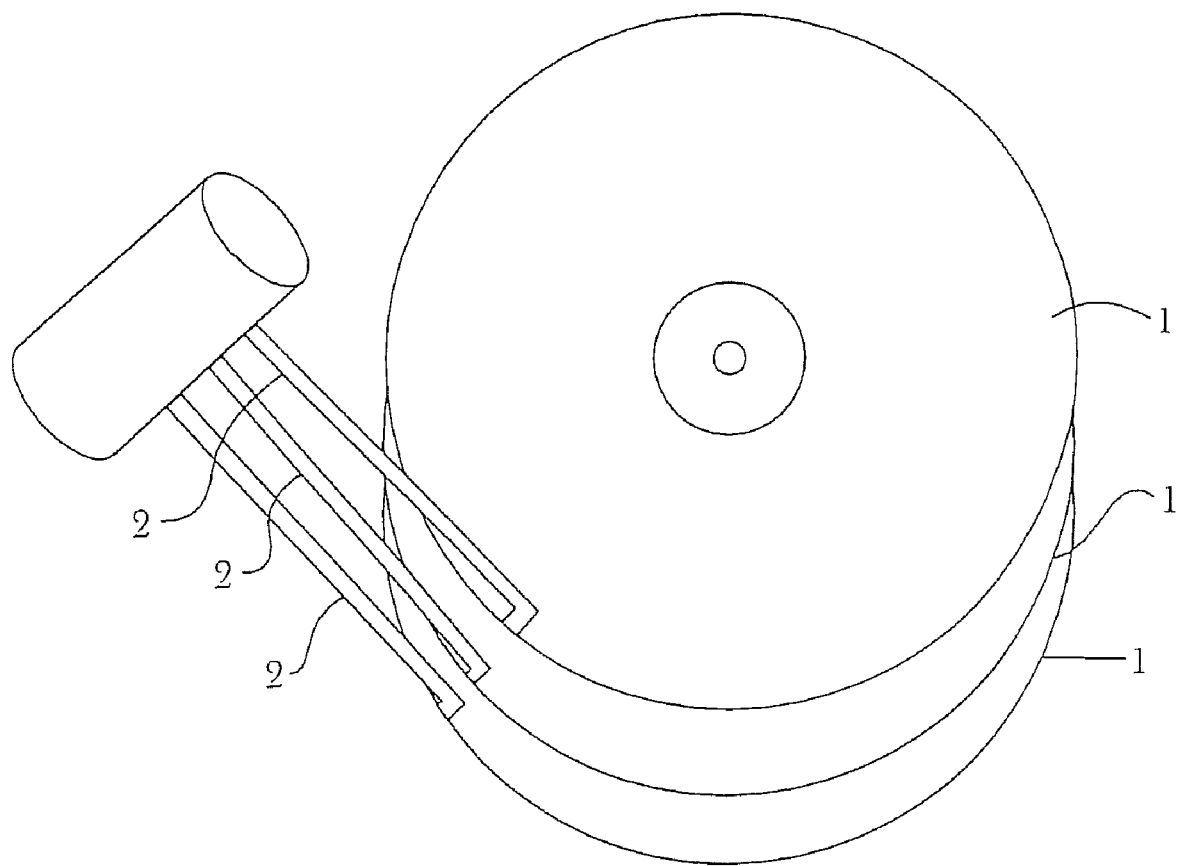
FIG. 1 is a view of a typical hard-disk drive that can be used in accordance with the techniques of the present invention.
Figure 2:
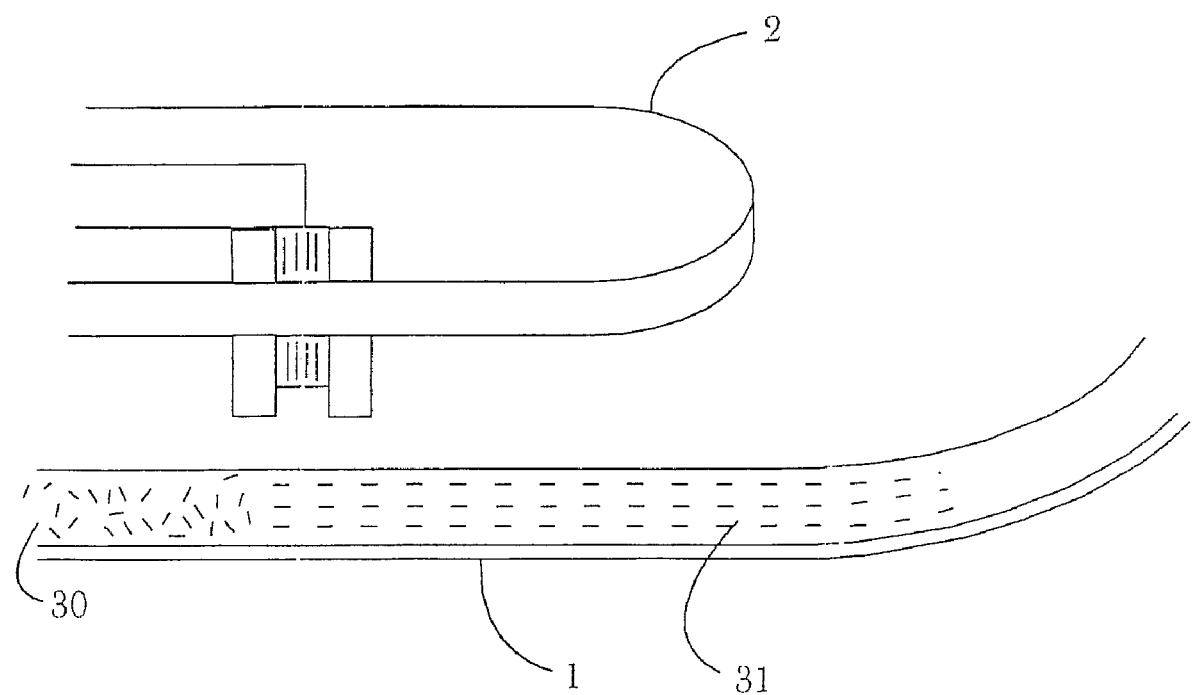
FIG. 2 shows a read-write head for arranging magnetic domains in a magnetic disk.

FIG. 1 shows a typical prior art hard-disk drive in a computer. This prior art hard-disk drive can be used substantially as shown in accordance with certain embodiments and novel techniques of the present invention. The prior art hard-disk drive typically comprises one or more disks 1 (in FIG. 1, three disks are shown) that are in communication with read-write heads 2. The read-write heads are capable of communicating with each disk in one of several predetermined manners. Specifically, as shown generally in FIG. 2, the heads 2 are capable of influencing magnetic domains 30 present in the disk 1. These influenced magnetic domains are represented by the number 31, while non-influenced domains are represented by the number 30, as shown in FIG. 2. The read-write heads 2 can first influence the magnetic domains 30 on the disks 1 by applying, for example, small currents through the heads 2 to create a magnetic field in the heads 2, which heads 2 in turn implant a desired effect into said domains (e.g., the magnetic field created by heads 2 can cause the unaligned magnetic domains 30 to become oriented domains 31, such orientation occurring in a controlled manner). Once the domains 31 are appropriately oriented, they can then be read, if desired, by the same read-write heads 2. The domains 31 can be oriented parallel to the plane of rotation of the disk 1, or the domains 31 can be oriented perpendicular to the plane of rotation of the disk 1. When the domains 31 are oriented substantially parallel to the rotation plane of the disk 1, various electrical/magnetic induction techniques for the reading of the domains 31 are appropriate. However, when the domains 31 are oriented substantially perpendicular to the rotation plane of the disk 1, standard induction reading techniques do not function as well (e.g., crosstalk between closely located bits can occur and unacceptable signal to noise ratios result). Accordingly, development of magnetoresistive and giant magnetoresistive heads has occurred. Briefly, these techniques involve the detection of very small changes in the electrical resistance of one or more materials comprising the read head 2. A primary difference between magnetoresistive heads and giant magnetoresistive heads is that giant magnetoresistive heads are two or three times more sensitive than magnetoresistive heads due to their novel structure which includes the layering of different materials on top of each other.

Somewhat conventional data storage techniques can be used in combination with the techniques of the present invention without the requirement for significant changes in current hardware being utilized. For example, the magnetic storage media of the prior art can be used to store data associated with Zeeman splitting and/or shilling effects. Moreover, the digital information that is stored on such media can be similar to or different from prior art digital data storage techniques. Specifically, rather than storing only a combination of sequences of "0"s and "1"s, the present invention can use more than two stored magnetic field strengths to result in different field strengths that can be applied elsewhere and which can thus result in Zeeman splitting or shifting in the magnetic media, or Zeeman splitting or shifting occurring in a contiguous media (e.g., either with one or more materials comprising the magnetic storage media or either one or more materials, such as a solid, a liquid, a gas and/or a plasma, comprising the read head). In other words, the different field strengths stored in a suitable magnetic media can result in differing amounts of Zeeman splitting or shifting in an appropriately chosen material, which detected Zeeman splitting or shifting corresponds to the different digital (or analog) values within a coded system. For example, in a base-4 system, a "0" stored on the magnetic media could correspond to a bit with no magnetic field; a "1" could correspond to a stored field strength of "x" microTesla to the bit; a "2" could correspond to a field strength of "5x" microTesla stored to the bit; and a "3" could correspond to a field strength of "10x" microTesla stored to the bit. The particular field strengths chosen here are exemplary, and it should be understood that differences in field strengths are simply a matter of design choice (e.g., convenient differences in magnetic field strengths should be a function of the magnetic media utilized to store information as well as the hardware utilized to store and retrieve such information and the media in which Zeeman splitting and/or shifting is desired). The sensitivity of such media and/or hardware may dictate how much the difference in stored field strength needs to be between each bit so that the likelihood of misreading the information stored on any one bit, or combination of bits, due to, for example, poor signal/noise ratio or crosstalk, is minimized. Moreover, any Zeeman splitting and/or shifting outputs can be appropriately modified or amplified by conventional techniques.

One example of a suitable magnetic material which can be used to store a magnetic field is a ferromagnetic material. In particular, a ferromagnetic material that is capable of exhibiting different amounts of magnetic domain alignment as a function of increasing applied magnetic field, up to its natural magnetic saturation point. Examples of suitable ferromagnetic materials that can be used in connection with the present invention include gamma.$Fe_2O_3$, gamma-$Fe_2O_3$ modified by Co, $CrO_2$, etc.

Figure 5:
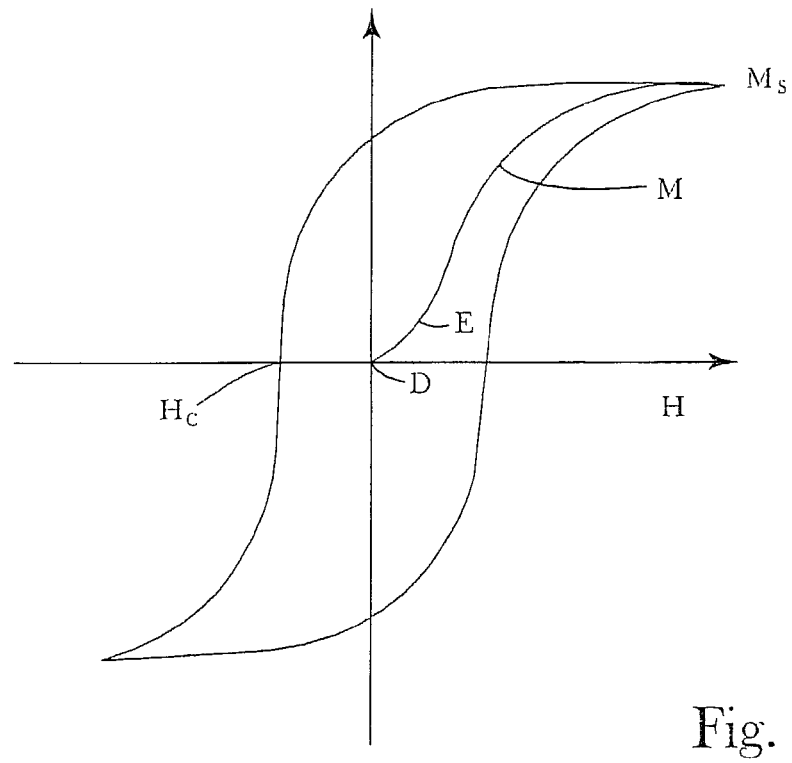
FIG. 5 shows a representative hysteresis curve for a ferromagnetic material that is used as a magnetic memory material in the present invention.

FIG. 5 shows a typical hysteresis curve or hysteresis loop for a typical ferromagnetic material that can be used in the present invention. Initially, at a point "D" no field "H" is applied and no magnetization is present in the virgin ferromagnetic material. However, as a field H is applied, the magnetization of domains begins at the point "D" and increases along the curve "M" up to the point of saturation ($M_s$). It should be noted that the initial magnetization or alignment of domains along the curve "M" is up to about the point "E", in this FIG. 4, and is reversible. However, when enough field H is applied to achieve a position on the curve M which corresponds to a magnetic field which is beyond the point "E", the domains are frozen into place (i.e., will not move substantially unless influenced by, for example, another external magnetic field of greater strength or of a reverse polarity). This curve is known as a "hysteresis curve". A suitable ferromagnetic material for use in the present invention exhibits a substantially infinite number of possible induced magnetizations along the curve M. It is these varying induced magnetizations that will be utilized to create different amounts of Zeeman splitting or shifting (discussed later herein) in the ferromagnetic materials per se, or in one or more materials which are placed contiguous to the ferromagnetic materials.

The magnetization induced in a ferromagnetic material can be increased up to the point $M_s$, whereby any higher magnetic fields will not result in any additional domain alignment. As the applied magnetic field H is reduced to zero, the induced magnetization in the ferromagnetic material does not reduce to zero, but rather, has a remnant magnetization or resonance noted as $B_r$. It should be noted that ferromagnetic materials do not typically exhibit or hold the same magnetic field that is applied to them. For example, if a field of 10 micro Tesla was applied, the magnetization induced in the ferromagnetic material, if measured as a field, would be less than 10 micro Tesla, for example, 7 micro Tesla. This factor needs to be accounted for in the present invention, but is not a substantial issue and an artisan of ordinary skill in this field will understand how to proceed in accordance with the other teachings contained herein.

In order to understand the influence of magnetic fields on various Zeeman splitting or shifting frequencies, the following discussions of Fine Structure Frequencies, Hyperfine Structure Frequencies and Magnetic Fields are provided. These discussions are taken, in part, from PCT Application No. PCT/US01/28,392, entitled "Spectral Chemistry", which was filed on Sep. 11, 2001, the subject matter of which is expressly incorporated herein by reference.

Fine Structure Frequencies

The field of science concerned generally with measuring the frequencies of energy and matter, known as spectroscopy is well known. Specifically, there are three broad classes of atomic and molecular spectra: (1) electronic spectra, which are due to electron transitions, have frequencies which occur primarily in the ultraviolet (UV), visible, and infrared (IR) regions, and are present in both atoms and molecules; (2) vibrational spectra, which are due to, for example, bond motion between individual atoms within molecules, occur primarily in the IR regions, and are present in molecules and (3) rotational spectra which are due primarily to the rotation of molecules in space and have microwave or radiowave frequencies, and also occur in molecules.

The three broad classes of spectra discussed above have been oversimplified. There are actually at least three additional sets of spectra, namely, the fine structure spectra, the hyperfine structure spectra and the superfine structure spectra. These additional spectra occur in atoms and molecules, and extend in frequencies, for example, from the ultraviolet down to the low radio regions. These additional spectra are often mentioned in prior art chemistry and spectroscopy books typically as an aside, because prior art chemists usually focus more on the traditional types of spectroscopy, namely, electronic, vibrational, and rotational.

The fine and hyperfine spectra are quite prevalent in the areas of physics and radio astronomy. For example, cosmologists map the locations of interstellar clouds of hydrogen, and collect data regarding the origins of the universe by detecting signals from outerspace, for example, at 1.420 GHz, a microwave frequency which is one of the hyperfine splitting frequencies for hydrogen. Most of the large databases concerning the microwave and radio frequencies of molecules and atoms have been developed by astronomers and physicists, rather than by chemists. This apparent inattention by chemists, physicists and materials scientists of the fine, hyperfine, and superfine spectra, has apparently resulted in little attention being given, if any, to these potentially useful spectra.

In addition to the fine splitting frequencies for atoms (i.e., heterodynes), molecules also have similar fine structure frequencies. The origin and derivation for molecular fine structure and splitting or shifting is different from that for atoms, however, the graphical and practical results are quite similar. In atoms, the fine structure frequencies are said to result from the interaction of the spinning electron with its' own magnetic field. Basically, this means the electron cloud of a single atomic sphere, rotating and interacting with its' own magnetic field, produces the atomic fine structure frequencies. The prior art refers to this phenomena as "spin-orbit coupling". For molecules, the fine structure frequencies correspond to the actual rotational frequencies of the electronic or vibrational frequencies. So the fine structure frequencies for atoms and molecules both result from rotation. In the case of atoms, it is the atom spinning and rotating around itself, much the way the earth rotates around its axis. In the case of molecules, it is the molecule spinning and rotating through space.

Hyperfine Structure Frequencies

Hyperfine structure frequencies are similar to the fine structure frequencies. Fine structure frequencies can be seen by magnifying a portion of a standard frequency spectrum. Hyperfine frequencies can be seen by magnifying a portion of a fine structure spectrum. Fine structure splitting frequencies occur at lower frequencies than the electronic spectra, and are located primarily in the infrared and microwave regions of the electromagnetic spectrum. Hyperfine splitting frequencies occur at even lower frequencies than the fine structure spectra, primarily in the microwave and radio wave regions of the electromagnetic spectrum. Fine structure frequencies are generally caused by at least the electron interacting with its' own magnetic field. Hyperfine frequencies are generally caused by at least the electron interacting with the magnetic field of the nucleus.

Figure 11:
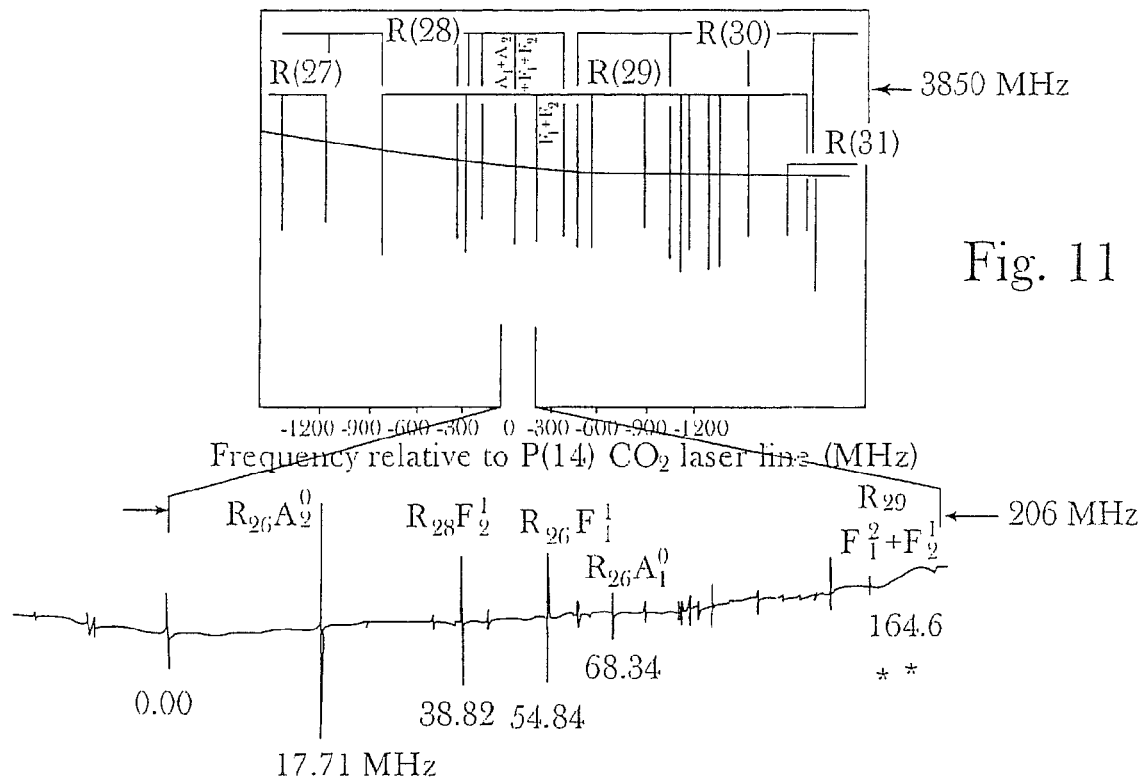
FIG. 11 shows a fine structure spectrum for $SF_6$ from 0-300 being magnified.
Figure 12A:
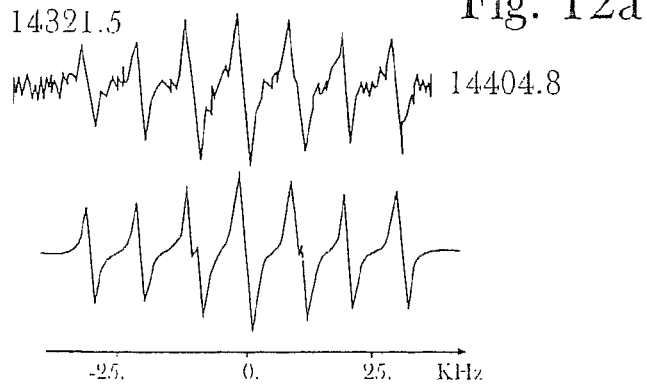
FIGS. 12a and 12b show the magnification of two curves from the fine structure of $SF_6$ showing hyperfine structure frequencies. Note the regular spacing of the hyperfine structure curves.
Figure 12B:
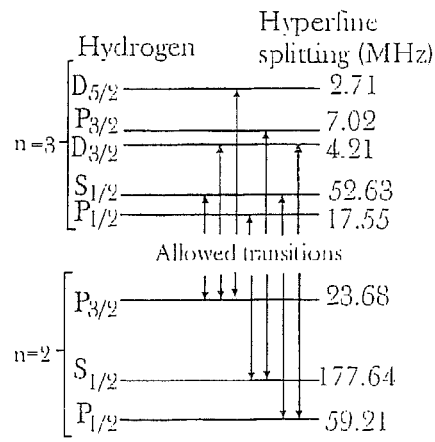
Figure 12B:
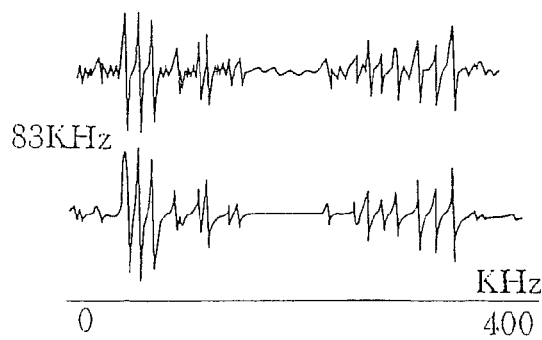

An example of hyperfine splitting can be seen in FIGS. 11 and 12. Specifically, what appears to be a single crisp curve in FIG. 11, turns out to be a series of several curves spaced very close together. These are the hyperfine frequency curves. Accordingly, the fine structure spectra is comprised of several more curves spaced very close together. These other curves spaced even closer together correspond to the hyperfine frequencies.

FIGS. 12a and 12b show that the spacing of the hyperfine frequency curves are very close together and at somewhat regular intervals. The small amount that the hyperfine curves are split apart is called the hyperfine splitting frequency. The hyperfine splitting frequency is also a heterodyne. This concept is substantially similar to the concept of the fine splitting frequency. The difference between two curves that are split apart is called a splitting frequency. As before, the difference between two curves is referred to as a heterodyne frequency. So, hyperfine splitting frequencies are all heterodynes of hyperfine frequencies. Because the hyperfine frequency curves result from a magnification of the fine structure curves, the hyperfine splitting frequencies occur at only a fraction of the fine structure splitting frequencies. The fine structure splitting frequencies are really just several curves, spaced very close together around the regular spectrum frequency. Magnification of fine structure splitting frequencies results in hyperfine splitting frequencies. The hyperfine splitting frequencies are really just several more curves, spaced very close together. The closer together the curves are, the smaller the distance or frequency separating them. Now the distance separating any two curves is a heterodyne frequency. So, the closer together any two curves are, the smaller (lower) is the heterodyne frequency between them. The distance between hyperfine splitting frequencies (i.e., the amount that hyperfine frequencies are split apart) is the hyperfine splitting frequency. It can also be called a constant or interval.

As a general example, the electronic spectrum frequency of hydrogen is 2,466 THz. The 2,466 THz frequency is made up of fine structure curves spaced 10.87 GHz (0.01087 THz) apart. Thus, the fine splitting frequency is 10.87 GHz. Now the fine structure curves are made up of hyperfine curves. These hyperfine curves are spaced just 23.68 and 59.21 MHz apart. Thus, 23 and 59 MHz are both hyperfine splitting frequencies for hydrogen. Other hyperfine splitting frequencies for hydrogen include 2.71, 4.21, 7.02, 17.55, 52.63, 177.64, and 1,420.0 MHz. The hyperfine structure frequencies are spaced even closer together than the fine structure frequencies, so the hyperfine splitting frequencies are smaller and lower than the fine splitting frequencies.

Figure 13:
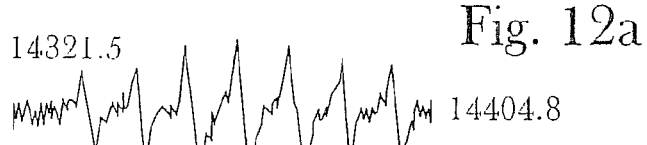
FIG. 13 shows an energy level diagram corresponding to the hyperfine splitting for the hyperfine structure in the n=2 to n=3 transition for hydrogen.

Thus, the hyperfine splitting frequencies are lower than the fine splitting frequencies. This means that rather than being in the infrared and microwave regions, as the fine splitting frequencies can be, the hyperfine splitting frequencies are in the microwave and radiowave regions. These lower frequencies are in the GHz ($10^9$ hertz), MHz ($10^6$ hertz) and KHz ($10^3$ hertz) regions of the electromagnetic spectrum. Several of the hyperfine splitting frequencies for hydrogen are shown in FIG. 13. (FIG. 13 shows hyperfine structure in the n=2 to n=3 transition of hydrogen).

Magnetic Fields

In spectral terms, magnetic fields can behave in a similar manner to electric fields. Specifically, the spectral frequency lines of, for example, atoms and molecules, can be split and/or shifted by a magnetic field. In this case, the external magnetic field from outside the atom or molecule, interacts with the electric and magnetic fields already inside the atom or molecule.

This action of an external magnetic field on spectral lines is called the "Zeeman Effect", in honor of its' discoverer, Dutch physicist Pieter Zeeman. In 1896, Zeeman discovered that the yellow flame spectroscopy "D" lines of sodium were broadened when the flame was held between strong magnetic poles. It was later discovered that the apparent broadening of the sodium spectral lines was actually due to their splitting and shifting. Zeeman's original observation has evolved into a separate branch of spectroscopy relating to the study of atoms and molecules by measuring the changes of the spectral lines in atoms and molecules caused by a magnetic field. This in turn has evolved into the nuclear magnetic resonance spectroscopy and magnetic resonance imaging used in medicine, as well as the laser magnetic resonance and electron spin resonance spectroscopy used in physics and chemistry.

The Zeeman effect for the famous "D" lines of sodium is shown in FIGS. 14a and 14b. FIG. 14a shows the Zeeman effect for sodium "D" lines; whereas FIG. 14b shows the energy level diagram for the transitions in the Zeeman effect for the sodium "D" lines. The "D" lines are traditionally said to result from transition between the $3p^2P$ and $3s^2S$ electron orbitals. As is shown, each of the single spectral frequencies is split into two or more slightly different frequencies, which center around the original unsplit frequency.

In this Zeeman effect, the amount that the spectral frequencies are split apart depends on the strength of the applied magnetic field. FIG. 15 shows Zeeman splitting effects for the oxygen atom as a function of magnetic field. When there is no magnetic field, there are two single frequencies at zero and 4.8. When the magnetic field is at low strength (e.g., 0.2 Tesla) there is just slight splitting and shifting of the original two frequencies. However, as the magnetic field is increased, the frequencies are split and shifted farther and farther apart. The degree of splitting and shifting in the Zeeman effect, depending on magnetic field strength, is shown in FIG. 16 for the $^3P$ state of silicon.

This Zeeman effect, due to an externally applied magnetic field, is slightly different from the Zeeman effect from an internal magnetic field depending on whether an atom or molecule is subjected to the magnetic field. The Zeeman effect on atoms can be divided into three different magnetic field strengths: weak; moderate; and strong. If the magnetic field strength is weak, the amount that the spectral frequencies will be shifted and/or split apart will be very small. The shifting away from the original spectral frequency will still stimulate the shifted frequencies. This is because they will be so close to the original spectral frequency that they will still be well within its resonance curve. As for the splitting, it is so small, that it is even less than the hyperfine splitting that normally occurs. This means that in a weak magnetic field, there will be only very slight splitting of spectral frequencies, translating into very low splitting frequencies in the lower regions of the radio spectrum and down into the very low frequency region. For example, the Zeeman splitting frequency for the hydrogen atom, which is caused by the earth's magnetic field, is around 30 KHz. Larger atoms have even lower frequencies in the lower kilohertz and even hertz regions of the electromagnetic spectrum.

At the other end of magnetic field strength, is the very strong magnetic field. In this case, the splitting apart and shifting of the spectral frequencies will be very wide. With this wide shifting of frequencies, the difference between the split and/or shifting frequencies will be much larger than the difference between the hyperfine splitting frequencies. This translates to Zeeman effect splitting and/or splitting frequencies at higher frequencies than the hyperfine splitting frequencies. This splitting occurs somewhere around the microwave region.

The moderate magnetic field strength case is more complicated. The shifting and splitting caused by the Zeeman effect from a moderate magnetic field will be approximately equal to the hyperfine splitting and/or shifting. Although not widely discussed in the prior art, it is possible to apply a moderate magnetic field to an atom, to produce Zeeman splitting which is substantially equivalent to its' hyperfine splitting.

The moderate magnetic field causes low frequency Zeeman splitting that matches and hence energizes the low frequency hyperfine splitting frequency in the atom. However, the low hyperfine splitting frequencies actually correspond to the heterodyned difference between two vibrational or fine structure frequencies. When the hyperfine splitting frequency is stimulated, the vibrational or fine structure frequencies will be stimulated, and electronic frequencies will eventually be stimulated. This in turn causes the atom to be, for example, stimulated.

Figure 17A:
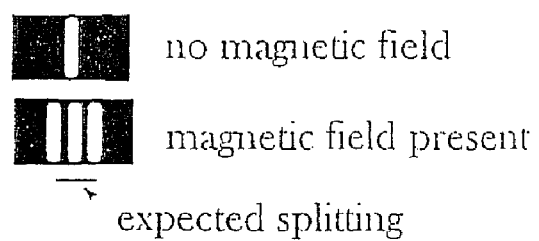
FIG. 17a is a pictorial which shows a normal Zeeman effect and FIG. 17b is a pictorial which shows an anomalous Zeeman effect.
Figure 17B:
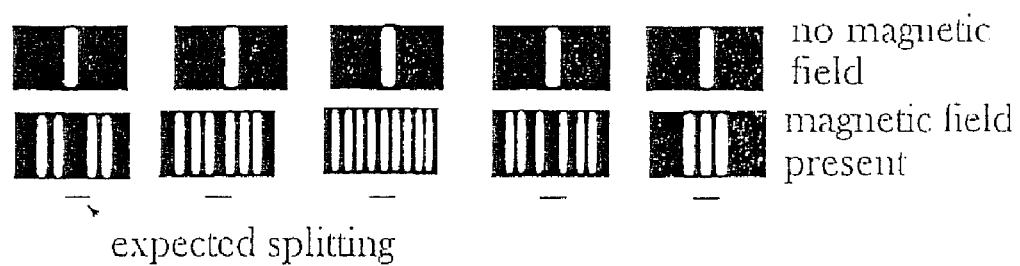
Figure 18:
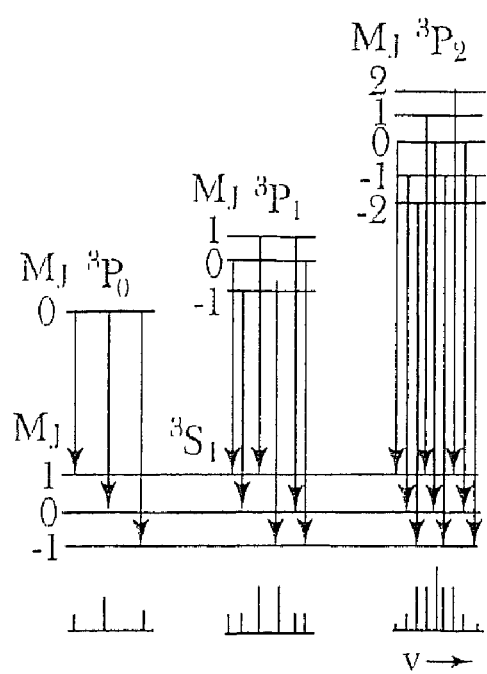
FIG. 18 shows anomalous Zeeman effect for zinc $^3P \rightarrow ^3S$.

There is also a difference between the "normal" Zeeman effect and the "anomalous" Zeeman effect. With the "normal" Zeeman effect, a spectral frequency is split by a magnetic field into three frequencies, with expected even spacing between them (see FIG. 17a which shows the "normal" Zeeman effects and FIG. 17b which shows the "anomalous" Zeeman effects). One of the new split frequencies is above the original frequency, and the other new split frequency is below the original frequency. Both new frequencies are split the same distance away from the original frequency. Thus, the difference between the upper and original and the lower and original frequencies is about the same. This means that in terms of heterodyne differences, there are at most, two new heterodyned differences with the normal Zeeman effect. The first heterodyne or splitting difference is the difference between one of the new split frequencies and the original frequency. The other splitting difference is between the upper and lower new split frequencies. It is, of course, twice the frequency difference between either of the upper or lower frequencies and the original frequency. In many instances the Zeeman splitting produced by a magnetic field results in more than three frequencies, or in splitting that is spaced differently than expected. This is called the "anomalous" Zeeman effect (see FIGS. 17 and 18; wherein FIG. 18 shows an anomalous Zeeman effect for zinc 3p→3s.

Figure 19A:
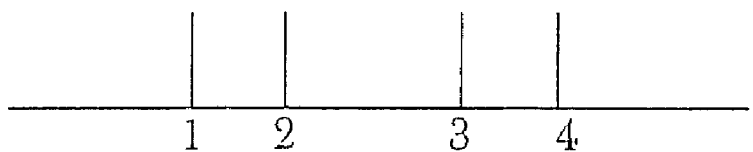
FIG. 19a shows a graphic representation of four Zeeman splitting frequencies and FIG. 19b shows a graphic representation of four new heterodyned differences.
Figure 19B:
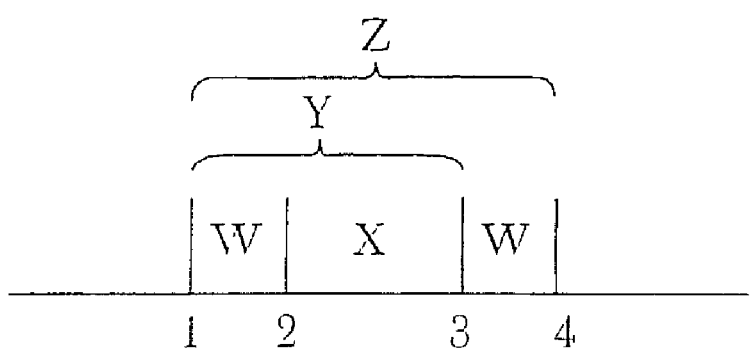

If there are still just three frequencies, and the Zeeman effect is anomalous because the spacing is different than expected, the situation is similar to the normal effect. However, there are at most, two new splitting frequencies that can be used. If, however, the effect is anomalous because more than three frequencies are produced, then there will be a much more richly varied situation. Assume an easy case where there are four Zeeman splitting frequencies (see FIG. 19a and FIG. 19b). FIG. 19a shows four Zeeman splitting frequencies and FIG. 19b shows four new heterodyned differences.

In this example of anomalous Zeeman splitting, there are a total of four frequencies, where once existed only one frequency. For simplicity's sake, the new Zeeman frequencies will be labeled 1, 2, 3, and 4. Frequencies 3 and 4 are also split apart by the same difference "w". Thus, "w" is a heterodyned splitting frequency. Frequencies 2 and 3 are also split apart by a different amount "x". So for there are two heterodyned splitting frequencies, as in the normal Zeeman effect.

However, frequencies 1 and 3 are split apart by a third amount "y", where "y" is the sum of "w" and "x". And, frequencies 2 and 4 are also split apart by the same third amount "y". Finally, frequencies 1 and 4 are split even farther apart by an amount "z". Once again, "z" is a summation amount from adding "w+x+w". Thus, the result is four heterodyned frequencies: w, x, y, and z in the anomalous Zeeman effect.

If there were six frequencies present from the anomalous Zeeman effect there would he even more heterodyned differences. Thus, the anomalous Zeeman effect results in far greater flexibility in the choice of frequencies when compared to the normal Zeeman effect. In the normal Zeeman effect the original frequency is split into three evenly spaced frequencies, with a total of just two heterodyned frequencies. In the anomalous Zeeman effect the original frequency is split into four or more unevenly spaced frequencies, with at least four or more heterodyned frequencies.

The following discussion will focus on the Zeeman effect in molecules. Molecules come in three basic varieties: ferromagnetic; paramagnetic; and diamagnetic. Ferromagnetic molecules are what comprises typical magnetic storage media and are thus capable of being used in the present invention. These materials typically hold a strong magnetic field due to domain alignment induced by the application of an external magnetic material and are composed of typical magnetic elements such as iron, cobalt, and/or nickel.

Paramagnetic molecules hold only a weak magnetic field and are thus not of primary interest in the present invention as magnetic strength storage materials.

A strong magnetic field will produce splitting greater than the hyperfine frequencies, in the microwave and infrared regions of the EM spectrum in atoms and paramagnetic molecules.

A moderate magnetic field will produce Zeeman splitting in atoms and paramagnetic molecules at frequencies on par with the hyperfine and rotational splitting frequencies.

Finally, consider the direction of the magnetic field in relation to the orientation of the molecule. When the magnetic field is parallel to an exciting electromagnetic field, π frequencies are produced. When the magnetic field is perpendicular to an exciting electromagnetic field, σ frequencies are found. It is important to remember that field orientation can result in different frequencies.

Figure 3:
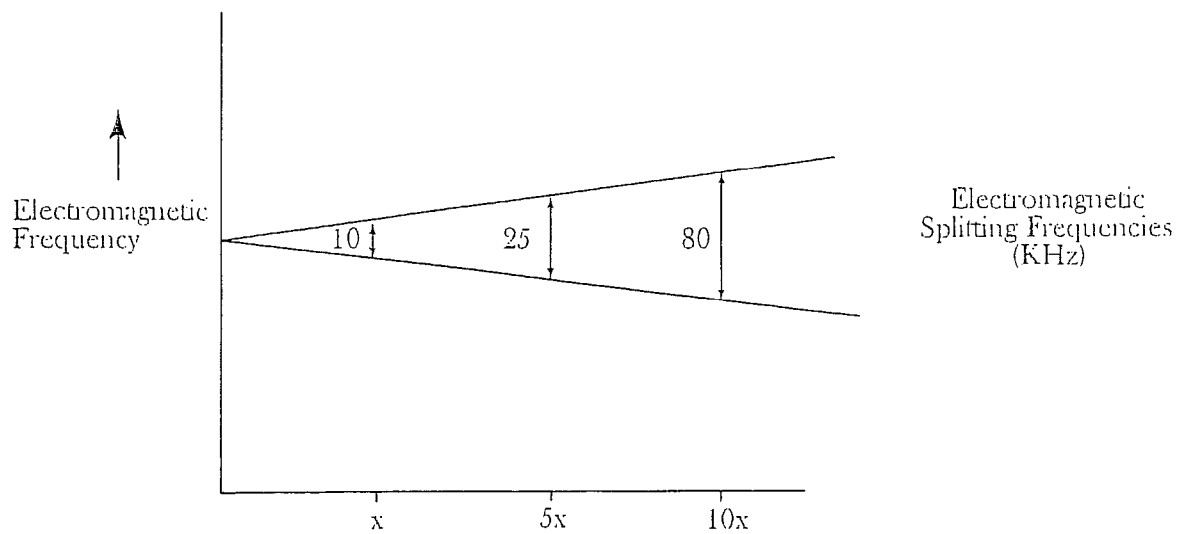
FIG. 3 is a graph which shows an electromagnetic frequency as a function of magnetic field strength which results in different electromagnetic splitting frequencies which can correspond to stored bits of information on magnetic storage media.

Accordingly, in a first embodiment of the present invention, in order to determine any field strength data stored on appropriate magnetic media, the magnetic media per se (or in an alternative embodiment, a material (e.g., a solid, a liquid, a gas and/or a plasma) contiguous to the magnetic media either forming a part of the magnetic media or part of an interrogating (i.e., read head) needs to be appropriately interrogated for the presence of differing amounts of Zeeman splitting and/or shifting. A suitable form of interrogation of such stored information could be, for example, a spectroscopic interrogation. For example, in reference to FIG. 3 the magnetic media utilized to store the different induced field strengths of "0", "x", 5x" and "10x" microTesla, could themselves exhibit or show particular Zeeman splitting frequencies for each of the different magnetic field strengths. Alternatively, the different stored field strengths could result in Zeeman splitting in a contiguous material (or multiple contiguous materials). The contiguous material could form part of the magnetic media, or could form part of an interrogation assembly such as read/write head. The Zeeman splitting and/or shifting frequencies which arise are a function of the actual material which comprises the magnetic media, as well as the field strength applied thereto. In this regard, for example, as shown in FIG. 3, assuming for illustrative purposes that the exemplary magnetic media exhibited a Zeeman splitting frequency of 10 KHz for a magnetic field strength of "x" microTesla, 25 KHz for a magnetic field strength of "5x" microTesla and 80 KHz for a magnetic field strength of "10x" microTesla. Thus, in order to read any of the bits of information stored on the exemplary magnetic media, each bit of stored information would need to be interrogated directly by applying one or more of the frequencies mentioned above (alternatively, a material contiguous (as discussed elsewhere herein) to the magnetic media could be similarly interrogated to determine Zeeman splitting and/or shifting). Specifically, in a first interrogation approach, a system could be designed such that each bit of information stored in a magnetic media could be interrogated with each known potential splitting frequency that could be present on each bit; or a system could be designed such that once a known splitting frequency had been found to be located at the bit, the interrogation process could stop. The particular approach is a matter of preference and reliability. For example, one interrogation process according to the present invention proceeds as follows. If the magnetic media per se exhibits Zeeman splitting and/or shifting, then the first bit (i.e., the bit with no magnetic field), could be interrogated with all three frequencies (i.e., 10.25 and 80 KHz) or a sweep of frequencies (i.e., 10 KHz to 80 KHz). The interrogation system would recognize that none of these frequencies were present, and thus there is no stored magnetic field strength and the bit is a "0". The next bit could then be interrogated with the same frequencies and it would be discovered by the interrogation that a resonant amplitude spike returned from the bit or was absorbed by the bit at a frequency of 10 KHz. Further interrogation of the bit would show no other resonant amplitude spikes at the interrogation frequencies of 25 and 80 KHz. Thus, this bit would be "1". The next bit could then be interrogated with the same frequencies and if would be discovered by the interrogation process that a resonant amplitude spike returned from the bit at a frequency of 25 KHz. Further interrogation of the bit would show no other resonant amplitude spikes at the frequencies of 10 KHz and 80 KHz. Thus, this bit would be "2". The final bit could then be interrogated with the same frequencies and it would be discovered that a resonant amplitude spike returned from the bit at a frequency of 80 KHz. Further interrogation of the bit would show no other resonant amplitude spikes at the frequencies of 10 KHz and 25 KHz. Thus, the bit would be a "3". Accordingly, a reliable base-4 system can be achieved.

Alternatively, another interrogation process according to the present invention could proceed as follows; if the magnetic media has a plurality of induced field strengths recorded and each of the recorded magnetic field strengths per se exhibits different amounts of Zeeman splitting in either the magnetic media or in one or more contiguous material(s), then each of the bits providing different magnetic field strengths could be interrogated with, for example, a single interrogating electromagnetic energy of a suitable frequency. In this regard, if a frequency of, for example, 50 KHz was used as the interrogating frequency, then heterodynes (side bands) sum and difference frequencies, etc., could be expected to occur with those Zeeman splitting frequencies which occur in the magnetic media or in the contiguous material. Specifically, heterodyning can occur with each of the stored frequencies, 10, 25 and 80 KHz. In particular, some, but not all of the possible heterodyned frequencies would be as follows: 60 KHz (i.e., 50+10); 75 KHz (i.e., 50+25); and 130 KHz (i.e., 50+80). In other words, the application of a 50 KHz interrogating frequency would result in at least the aforementioned heterodyned frequencies, each of which could be caused to correspond to, for example, either a "1", a "2", or a "3", with no heterodynes present indicating the value of "0".

It should be noted that of each of the aforementioned processes, namely applying a series of frequencies or a single frequency when interrogating for heterodynes, can be used for interrogating either the magnetic material per se, or a contiguous material, said contiguous material being present in the magnetic media per se, adjacent to the magnetic media or as part of an interrogating system, such as a read/write head.

The following brief description of heterodyning is provided to assist in understanding certain aspects of the invention. However, for a more complete discussion of this important area, the reader is directed toward the aforementioned PCT Application entitled "Spectral Chemistry", which has been expressly incorporated herein by reference.

Electromagnetic energy consists of waves. The number of waves in a period of time can be counted. Usually, time is placed on the horizontal X-axis. The vertical Y-axis shows the strength or intensity of the wave. This is also called the amplitude. A weak wave will be of weak intensity and will have low amplitude. A strong wave will have high amplitude. Traditionally, the number of waves per second is counted, to obtain the frequency. Another name for "waves per second", is "hertz" (abbreviated "Hz"), Frequency=Number of waves/time=Waves/second=Hz.

Energy waves and frequency have some interesting properties, and may interact in some interesting ways. The manner in which wave energies interact, depends largely on the frequency. For example, when two waves of energy interact, each having the same amplitude, but one at a frequency of 400 Hz and the other at 100 Hz, the waves will add their frequencies, to produce a new frequency of 500 Hz (i.e., the "sum" frequency). The frequency of the waves will also subtract to produce a frequency of 300 HZ (i.e., the "difference" frequency). All wave energies typically add and subtract in this manner, and such adding and subtracting is referred to as heterodyning. Common results of heterodyning are familiar to most as harmonies in music.

There is a mathematical, as well as musical basis, to the harmonics produced by heterodyning. Consider, for example, a continuous progression of heterodyned frequencies. As discussed above, beginning with 400 Hz and 100 Hz, the sum frequency is 500 Hz and the difference frequency is 300 Hz. If these frequencies are further heterodyned, (added and subtracted) then new frequencies of 800 (i.e., 500+300) and 200 (i.e., 500−300) are obtained. The further heterodyning of 800 and 200 results in 1,000 and 600 Hz as shown in FIG. 4.

A mathematical pattern begins to emerge. Both the sum and the difference columns contain alternating series of numbers that double with each set of heterodynes. In the sum column, 400 Hz, 800 Hz, and 1,600 Hz, alternates with 500 Hz, 1000 Hz, and 2000 Hz. The same sort of doubling phenomenon occurs in the difference column.

Heterodyning of frequencies is the natural process that occurs whenever waveform energies interact. Heterodyning results in patterns of increasing numbers that are mathematically derived. The number patterns are integer multiples of the original frequencies. These multiples are called harmonics. For example, 800 Hz and 1600 Hz are harmonics of 400 Hz. In musical terms, 800 Hz is one octave above 400 Hz, and 1600 Hz is two octaves higher. It is important to understand the mathematical heterodyne basis for harmonics, which occurs in all waveform energies, and thus in all of nature.

A heterodyne is a mathematical function, governed by mathematical equations, just like a fractal. A heterodyne also produces self-similar patterns of numbers, like a fractal.

Heterodynes are fractals; the conclusion is inescapable. Heterodynes and fractals are both mathematical functions which produce a series of self-similar patterns or numbers. Wave energies interact in heterodyne patterns. Thus, all wave energies interact as fractal patterns.

Accordingly, since energy interacts by heterodyning, matter should also be capable of interacting by a heterodyning process. All matter whether in large or small forms, has what is called a natural oscillatory frequency. The natural oscillatory frequency ("NOF") of an object, is the frequency at which the object prefers to vibrate, once set in motion. The NOF of an object is related to many factors including size, shape, dimension, and composition. The smaller an object is, the smaller the distance it has to cover when it oscillates back and forth. The smaller the distance, the faster it can oscillate, and the higher its NOF.

For example, consider a wire composed of metal atoms. The wire has a natural oscillatory frequency. The individual metal atoms also have unique natural oscillatory frequencies. The NOF of the atoms and the NOF of the wire heterodyne by adding and subtracting, just the way energy heterodynes.

$NOF_{atom} + NOF_{wire} = $ Sum Frequency$_{atom+wire}$ and $NOF_{atoms} - NOF_{wire} = $ Difference Frequency$_{atom-wire}$ If the wire is stimulated with the Difference Frequency$_{a-tom-wire}$, the difference frequency will heterodyne (add) with the NOF$_{wire}$ to produce NOF$_{atom}$, (natural oscillatory frequency of the atom) and the atom will absorb with the energy, thereby becoming stimulated to a higher energy level. Cirac and Zoeller reported this phenomenon in 1995, and they used a laser to generate the Difference Frequency.

Difference Frequency$_{atom-wire} + $NOF$_{wire} = $NOF$_{atom}$

Matter heterodynes with matter in a manner similar to the way in which wave energies heterodyne with other wave energies. This means that matter in its various states may also interact in fractal processes. This interaction of matter by fractal processes assists in explaining why so many creatures and systems in nature exhibit fractal processes and patterns. Matter, as well as energy, interacts by the mathematical equations of heterodynes, to produce harmonics and fractal patterns. That is why there are fractals everywhere around us.

Thus, energy heterodynes with energy, and matter heterodynes with matter. However, perhaps even more important is that matter can heterodyne with energy (and visa versa). In the metal wire discussion above, the Difference Frequency$_{atom-wire}$ in the experiment by Cirac and Zoeller was provided by a laser which used electromagnetic wave energy at a frequency equal to the Difference Frequency$_{atom-wire}$. The matter in the wire, via its natural oscillatory frequency, heterodyned with the electromagnetic wave energy frequency of the laser to produce the frequency of an individual atom of matter. This shows that energy and matter do heterodyne with each other.

In general, when energy encounters matter, one of three possibilities occur. The energy either bounces off the matter (i.e., is reflected energy), passes through the matter (i.e., is transmitted energy), or interacts and/or combines with the matter (e.g., is absorbed or heterodynes with the matter). If the energy heterodynes with the matter, new frequencies of energy and/or matter will be produced by mathematical processes of sums and differences. If the frequency thus produced matches an NOF of the matter, the energy will be, at least partially, absorbed, and the matter will be stimulated to, for example, a higher energy level, (i.e., it possesses more energy). A crucial factor which determines which of these three possibilities will happen is the frequency of the energy compared to the frequency of the matter. If the frequencies do not match, the energy will either be reflected, or will pass on through as transmitted energy. If the frequencies of the energy and the matter match either directly (e.g., are close to each other, as discussed in greater detail later herein), or match indirectly (e.g., heterodynes), then the energy is capable of interacting and/or combining with the matter.

Another term often used for describing the matching of frequencies is resonance. In this invention, use of the term resonance will typically mean that frequencies of matter and/or energy match. For example, if the frequency of energy and the frequency of matter match, the energy and matter are in resonance and the energy is capable of combining with the matter. Resonance, or frequency matching, is merely an aspect of heterodyning that permits the coherent transfer and combination of energy with matter.

In the example above with the wire and atoms, resonance could have been created with the atom, by stimulating the atom with a laser frequency exactly matching the NOF of the atom. In this case, the atom would be energized with its own resonant frequency and the energy would be transferred to the atom directly. Alternatively, as was performed in the actual wire/laser experiment, resonance could also have been created with the atom by using the heterodyning that naturally occurs between differing frequencies. Thus, the resonant frequency of the atom (NOF$_{atom}$) can be produced indirectly, as an additive (or subtractive) heterodyned frequency, between the resonant frequency of the wire (NOF$_{wire}$) and the applied frequency of the laser. Either direct resonance, or indirect resonance through heterodyned frequency matching, produces resonance and thus permits the combining of matter and energy. When frequencies match, energy transfers.

Heterodyning produces indirect resonance. Heterodyning also produces harmonics, (i.e., frequencies that are integer multiples of the resonant (NOF) frequency. For example, the music note "A" is approximately 440 Hz. If that frequency is doubled to about 880 Hz, the note "A" is heard an octave higher. This first octave is called the first harmonic. Doubling the note or frequency again, from 880 Hz to 1,760 Hz (i.e., four times the frequency of the original note) results in another "A", two octaves above the original note. This is called the third harmonic. Every time the frequency is doubled another octave is achieved, so these are the even integer multiples of the resonant frequency.

In between the first and third harmonic is the second harmonic, which is three times the original note. Musically, this is not an octave like the first and third harmonics. It is an octave and a fifth, equal to the second "E" above the original "A". All of the odd integer multiples are fifths, rather than octaves. Because harmonics are simply multiples of the fundamental natural oscillatory frequency, harmonics stimulate the NOF or resonant frequency indirectly. Thus by playing the high "A" at 880 Hz on a piano, the string for middle "A" at 440 Hz should also begin to vibrate due to the phenomenon of harmonics.

Matter and energy in chemical reactions respond to harmonics of resonant frequencies much the way musical instruments do. Thus, the resonant frequency of the atom ($NOF_{atom}$) can be stimulated indirectly, using one or more of its' harmonic frequencies. This is because the harmonic frequency heterodynes with the resonant frequency of the atom itself ($NOF_{atom}$). For example, in the wire/atom example above, if the laser is tuned to 800 THz and the atom resonates at 400 THz, heterodyning the two frequencies results in:

800 THz–400 THz=400 THz

The 800 THz (the atom's first harmonic), heterodynes with the resonant frequency of the atom, to produce the atom's own resonant frequency. Thus the first harmonic indirectly resonates with the atom's NOF, and stimulates the atom's resonant frequency as a first generation heterodyne.

Of course, the two frequencies will also heterodyne in the other direction, producing;

800 THz+400 THz=1,200 THz

The 1,200 THz frequency is not the resonant frequency of the atom. Thus, part of the energy of the laser will heterodyne to produce the resonant frequency of the atom. The other part of the energy of the laser heterodynes to a different frequency, that does not itself stimulate the resonant frequency of the atom. That is why the stimulation of an object by a harmonic frequency of particular strength of amplitude, is typically less than the stimulation by its' own resonant (NOF) frequency at the same particular strength.

Although it appears that half the energy of a harmonic is wasted, that is not necessarily the case. Referring again to the exemplary atom vibrating at 400 THz, exposing the atom to electromagnetic energy vibrating at 800 THz will result in frequencies subtracting and adding as follows:

800 THz–400 THz=400 THz and

800 THz+400 THz=1,200 THz

The 1,200 THz heterodyne, for which about 50% of the energy appear to be wasted, will, heterodyne with other frequencies also, such as 800 THz. Thus, 1,200 THz–800 THz=400 THz Also, the 1,200 THz will heterodyne with 400 THz:

1,200 THz–400 THz=800 THz, thus producing 800 THz, and the 800 THz will heterodyne with 400 THz;

800 THz–400 THz=400 THz, thus producing 400 THz frequency again. When other generations of heterodynes of the seemingly wasted energy are taken into consideration, the amount of energy transferred by a first harmonic frequency is much greater than the previously suggested 50% transfer of energy. There is not as much energy transferred by this approach when compared to direct resonance, but this energy transfer is sufficient to produce a desired effect.

While FIG. 3 (discussed above in greater detail) shows, in graphic form, three specifically selected magnetic field strengths (i.e., 1x, 5x and 10x) and their corresponding (resultant) Zeeman splitting frequencies, it should be obvious to one of ordinary skill in this art that a virtually limitless series of possibilities exists for storage of higher order systems (i.e., higher than base-2 or a binary system), such systems being a function of the magnetic materials comprising the magnetic media, the Zeeman splitting/shifting frequencies generated in the magnetic media, or in a contiguous material, the accuracy of whatever transmitter(s) (e.g., a magnetic inductor, which generates a magnetic field) is used to induce a magnetic field in a magnetic media, and/or the accuracy of the reading system which is used to detect Zeeman splitting and/or shifting effects in the magnetic media (or in a material contiguous to the magnetic material) once such magnetic media (or contiguous material) has been interrogated. Thus, if large numbers of stored fields can result in correspondingly large numbers of Zeeman splitting or shifting frequencies, the use of Zeeman splitting and/or shifting effects can result in an analog or analog-like storage/retrieval of information.

For example, again referring to FIGS. 1 and 2, the Zeeman effect can be used to read information from a series of bits on the disks 1, but such information is retrieved differently from prior art approaches. In this regard, by utilizing the Zeeman splitting and/or shifting effects, for example, the present invention uses the magnetic domains 31 in a manner different (e.g., the magnetic domains may comprise more than two values and/or the magnetic domains may be interrogated, directly, or indirectly through the use of one or more contiguous material(s), in a different maimer) from prior art approaches. Specifically, the magnetic domains 31 are present on a disk 1. Current techniques allow these magnetic domains to assume "0" or "1" mode (i.e., a base-2 or binary code) and these are aligned in one of two possible combinations at pre-selected magnetic strengths. The present invention permits the magnetic storage media to be utilized in several unique ways. Specifically, for example, rather than storing only a combination or sequence of "0"s and "1"s the present invention stores more than two different field strengths to the magnetic disk 1, by influencing the magnetic media, for example, in a somewhat standard prior art approach. These different field strengths are stored by utilizing a read-write head 2 that is similar to conventional heads currently being utilized. The read-write head 2 is capable of imparting, and thus causing storage of different field strengths of different microTesla values upon the disk 1. Any desired combination of different field strengths can be stored upon the disk 1, and can be selected as a function of convenience and/or accuracy. In this regard, with regard to a base-6 system (i.e., "0, 1, 2, 3, 4, and 5"), the first bit of data stored can be no magnetic field, and can be made to correspond to "0". Each of the remaining five different possible values can be selected so that they correspond to different points along the curve "M" shown in FIG. 5. The differences between the stored field strengths are a matter of material design and system designer preferences. For this system, the choices of magnetic materials and/or materials which exhibit desirable Zeeman splitting or shifting may assist in dictating the difference in magnetic field strengths between different values in a coded system. Stated more particularly, materials engineers may desire certain types of magnetic materials to be utilized as magnetic storage media and such materials may have preferential field strengths which are unique to those materials. Moreover, such stored field strengths may result in desirable and detectable Zeeman splitting and/or shifting in the storage media per se, or such stored field strengths may be selected to result in desirable field splitting and/or shifting in one or more materials (e.g., a solid, a liquid, a gas and/or a plasma) contiguous to the magnetic media. Such preferential field strengths could then be maximized as both inputs and outputs in designing systems to be efficient, accurate and inexpensive. Such combinations of materials and/or systems should be apparent to those of ordinary skill of the art in view of the teachings herein.

In this Zeeman effect, when a relatively wide splitting of electromagnetic energy frequencies occurs due to the applied magnetic field, the amount of, for example, splitting may correspond to higher frequencies (e.g., microwave); whereas a narrow splitting will typically correspond to low frequencies (e.g., radio). The amount of splitting that occurs is important because in order to determine the amount of splitting that has occurred, a suitable interrogating electromagnetic energy is caused to be incident upon, for example, the magnetic material itself or the aforementioned contiguous material. The contiguous material that exhibits Zeeman splitting at the stored magnetic field can be present as, for example, one or more separate sheets of material that are located adjacent to, and/or contiguous with, the material that contains the stored magnetic field. When multiple contiguous materials are utilized, the present invention contemplates the use of a comparative analysis of the differences in Zeeman splitting between two or more such contiguous materials. Alternatively, a material comprising, for example, one or more material(s) that are mixed with the magnetic material (e.g., a binder which holds together at least a portion of the material that stores the magnetic field) could also be used. More specifically, a particular interrogating frequency, or set of frequencies, needs to be capable of favorably interacting with one or more of the splitting/shifting frequencies which result in the magnetic material, or in an alternative embodiment in one or more of the contiguous materials (e.g., a solid, a liquid, a gas and/or a plasma), due to the different magnetic fields stored in the magnetic material. In other words, a first material is desirably chosen so that an applied magnetic field can be reasonably stored in a magnetic material. However, it is desirable for the magnetic material to be capable of storing reliably several magnetic fields of different strength (e.g., capable of having varying numbers of magnetic domains align with an ever increasing magnetic field and such domains remain frozen or pinned so that they do not change with time) and, for example, in one embodiment of the invention, the contiguous material needs to be sensitive to the stored magnetic fields. In this regard, if one or more contiguous material(s) are utilized in connection with the magnetic material(s), the contiguous material(s) needs to exhibit a splitting of one or more of its rotational, vibrational, etc., bands (e.g., at the atomic or molecular level) and the resultant splitting that occurs in the contiguous material needs to be detectable by an appropriate interrogating electromagnetic source (discussed in greater detail elsewhere herein). Alternatively, a contiguous material does not need to be utilized. In this case, the magnetic material per se, or at least a portion thereof, needs to exhibit desirable and detectable splitting or shifting of one or more frequencies.

Accordingly, it should be clear that the Zeeman effect techniques of the present invention could be utilized in conjunction with current hardware systems. In this regard, so long as an appropriate field can cause to be stored in a magnetic media and the resultant Zeeman effect which occurs in the magnetic material per se, or various material(s) contiguous to the stored magnetic field, can be appropriately interrogated.

Thus, the present invention is a significant improvement over the prior art because current read-write heads use the ASCII code which is comprised of 0's and 1's in 8 different bits resulting in 256 different combinations of 0's and 1's. The present invention can harvest the advantage of codes that are higher order than binary.

The present invention also provides significant improvements over various optical memory techniques.

Specifically, in another embodiment of an alternative memory system of the present invention, a system somewhat analogous to current optical systems utilized in compact disk (CD) players is utilized.

Current CD technology utilizes a rotating disk comprised of a number of layers of different materials. The layers include polycarbonate plastic, aluminum and acrylic. The aluminum in the disk includes a series of plateaus and valleys sometimes referred to as "bumps". Laser light is caused to focus upon the plateaus and valleys in the rotating disk. The reflection of the laser off of the plateaus and valleys corresponds to a binary stream of information. CD's use, for example, 16-bit strings of binary coded data. Specifically, laser light reflects differently from a valley compared to the reflection off of a plateau and these different reflective properties of the laser when shined upon these valleys and plateaus correspond to the binary code of "0's" and "1's".

The present invention utilizes a similar concept to the CD disk, however, rather than utilizing valleys and plateaus (i.e., bumps) in an aluminum layer embedded in a polycarbonate plastic CD, the present invention utilizes at least two dots of different intensity color, or color width. These dots or spots are optically created and/or optically examined or interrogated. These optical dots or spots may be of a size which is approximately the same order of magnitude in size as the current data tracks used on CD's, they may be larger, or they may be smaller. Similar to the current CD's, these dots or spots are put together in strings which begin at an innermost portion of a rotatable CD disk and extend spirally out therefrom. Accordingly, current CD's of approximately 12 centimeters would be an acceptable size. However, if the dots or spots of the present invention are smaller than the "bumps" of the current technology, it is possible for CD's to be smaller in size while maintaining the same amount of memory space. Thus, it is possible to put an amount of optical information onto a rotatable disk of approximately 12 centimeters in diameter which exceeds that amount of information which is currently stored on CD's.

A first example of the invention utilizes a quaternary system which is depicted schematically in FIG. 4. In this regard, with reference to FIG. 4A, a polarized light source 40 (e.g., a light source from a laser that has been subjected to a polarizing filter) is projected through a polarizing filter 41 (sometimes referred to herein as an analyzer). When the polarized light source 40 and polarizing filter 41 are in alignment, then a white dot 42a is caused to appear on a recording media 43. This white dot may correspond to "0" in a base-4 code. With regard to FIG. 4B, the polarized light source 40 is projected upon the polarizing filter 41, however, in this Example, the filter 41 has been rotated about 30° with regard to the polarized light source 40. The disk 43 has also been rotated an appropriate amount of "x" so as to permit a separate recording of the dots 42a and 42b. This 30° rotation of the filter 41 results in the placement or recording of a dot 42b, that is somewhat gray upon the disk 43.

Figure 4A:
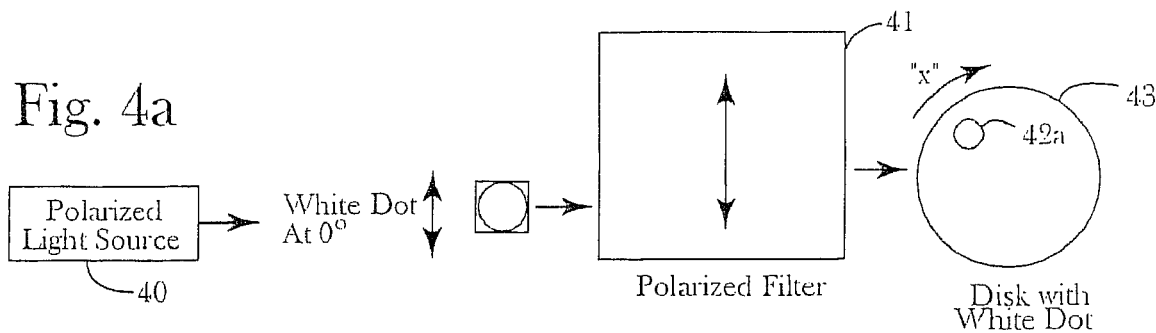
FIGS. 4a-4d show a polarized light source and a polarized filter utilized to create dots other than white and black in an optical system (e.g., optical CD's).
Figure 4B:
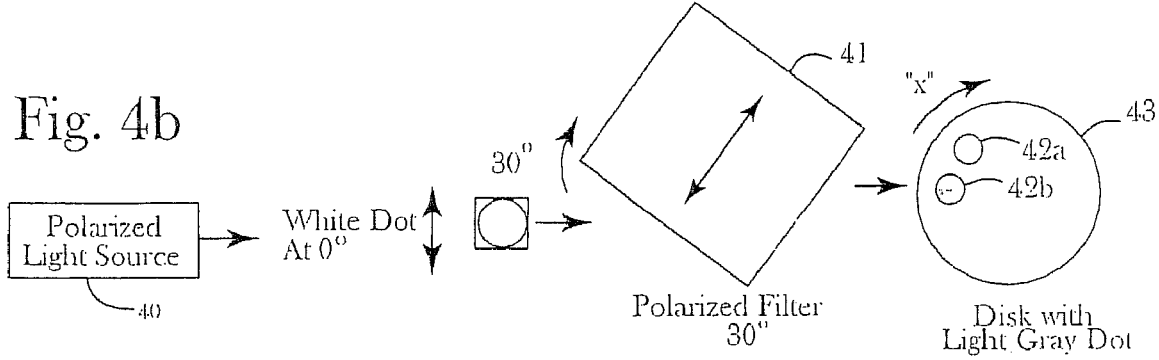
Figure 4C:
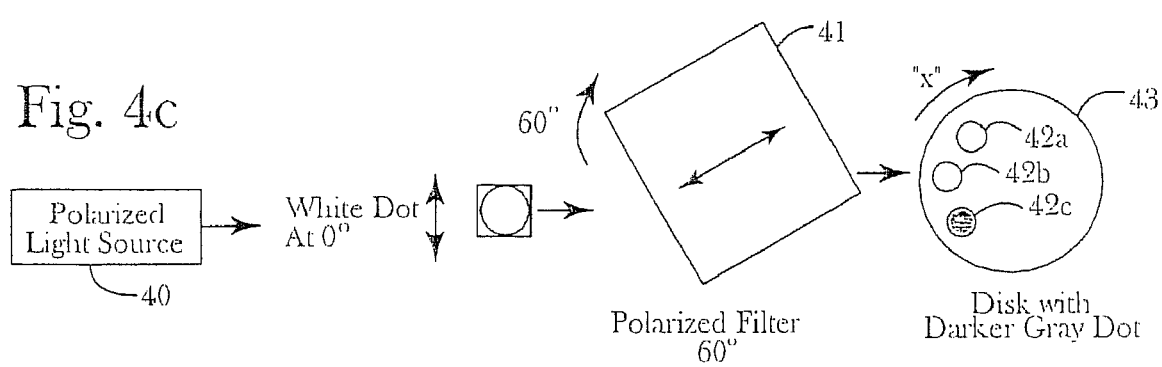

FIG. 4C shows the same polarized light source 40, however, the polarizing filter 41 is now arranged at an angle of about 60° relative to the source 40 so that a somewhat darker spot 42c is created. Again, the disk 43 has been rotated an amount "x" so as to permit the separate recording of the spot 42c upon the disk 43.

Figure 4D:
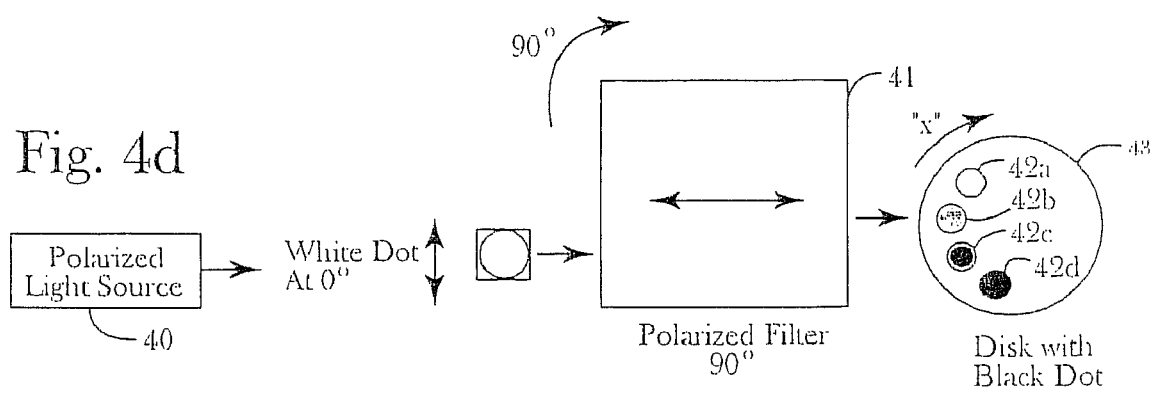

Likewise, with regard to FIG. 4D, the polarized light source 40 and the polarizing filter 41 are now at an angle of about 90° relative to the starting position of the polarizing filter 41 in FIG. 4a, resulting in a completely dark spot 42d being recorded upon the disk 43.

Figure 4E:
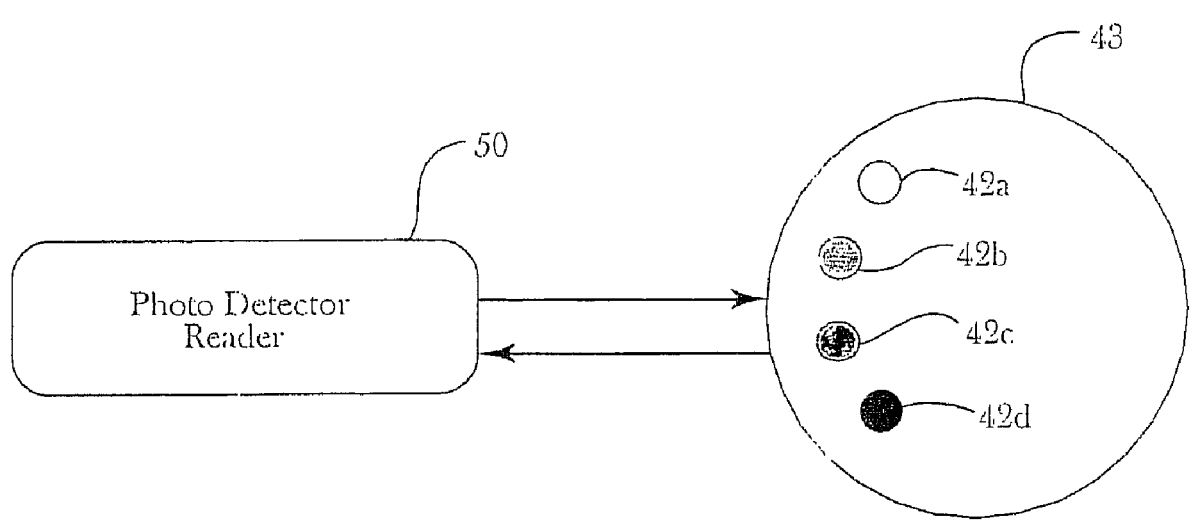
FIG. 4e shows a photo detector/reader which is utilized to read the optical images stored in a disk 43.

FIG. 4e shows a traditional photo detector 50 projecting a light source onto the disk 43 such that the dots 42a, 42b, 42c, and 42d on the disk 43 can be illuminated. Light is then reflected back to, for example, the detector portion of the photo detector 50. Specifically, the detector 50 is capable of distinguishing the white dot 42a front the black dot 42d, as well as the shades of gray clots 42b and 42c.

It should be apparent that the example depicted in FIG. 4 has been greatly exaggerated for clarity purposes, and, for example, the amount "x" that the disk 43 needs to move to accommodate the sequential dots 42a-42d, is minute. Additionally, as a result of recording the four different dots 42a-42d upon the disk 43, a base-4 or quaternary system has been utilized with the result recorded being "0"-"1"-"2"-"3". Still further, any appropriate media such as, for example, a PLZT ceramic, could be utilized to store different photo intensity data or spots. It should be apparent that the clots 42a-42d are the beginning of a track of data which can be recorded spirally outward from a center portion of a disk 43.

Another example of the invention comprises a base-8 code utilizing 8 different shades of dots. While this particular example is not shown in the Figures, it is clear that 8 different shades of dots would require the turning of the polarizing filter 41 shown in FIG. 4 at approximately 12.85° each time.

Another example, similarly, could utilize a 16 shade code system, which would require turning the polarizing filter 41 of FIG. 4 a total of 6° each time to result in 16 different shades of dots. It should be clear to an artisan of ordinary skill that the amount of data storage becomes a function of how finely the polarized filter 42 is rotated relative to the polarizing light source 41 as well as how accurately an optical detector 50 can distinguish between the different light intensities that are reflected or transmitted by the different shades of gray dots. It is certainly possible that an entire 256 character ASCII-type code can be written into a single bit. In such a case, the amount of data storage is significantly improved over the current techniques.

Still further, it should be apparent that different colors (e.g., red-yellow-violet), corresponding to different wavelengths of light can be placed upon a surface of a disk 43. When, for example, such a disk containing these different color dots or spots is rotated and interrogated by, for example, a laser lens system, the different colors (wavelengths or frequencies) of the dots or spots can be registered and could be coded to correspond to different values (e.g., "0", "1", "2", "3", etc.). Thus, rather than using a simple binary or base-2 system where a black dot corresponds to "0" and white clot corresponds to "1", the present invention provides for a larger number of options for data storage by providing methods to store data based on color, intensity or both. Accordingly, for example, in a simple quaternary system having a quaternary code consisting of 0's, 1's and 3's, there would be 4 different choices of basic information storage (i.e., a "base-4" system) rather than only two choices in a binary or base-2 system.

Figure 10A:
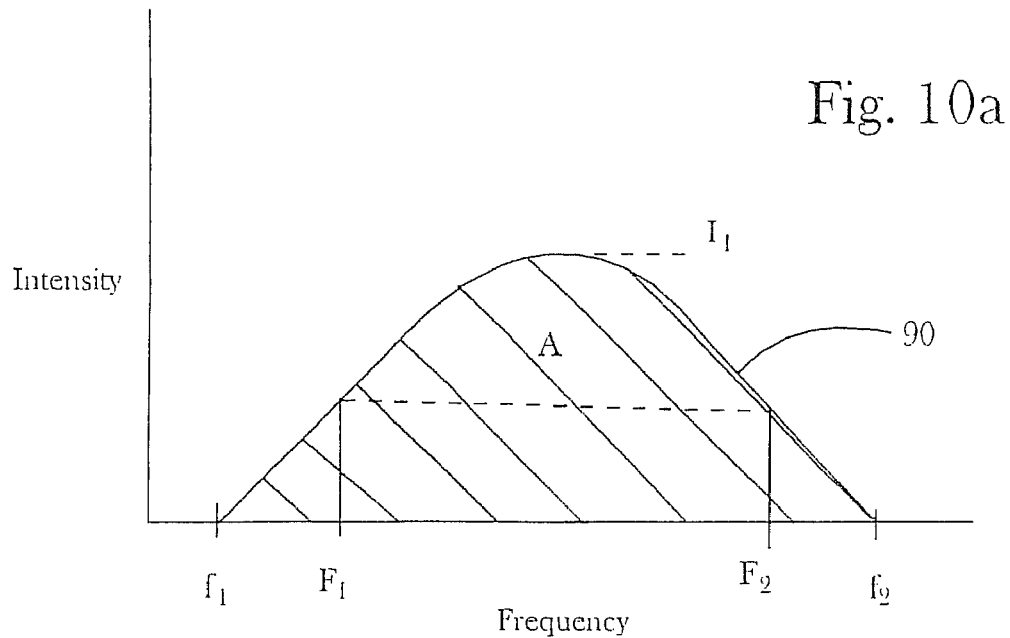
FIGS. 10a and 10b show a curve of polychromatic light that has been incident upon a polarizing filter and an analyzer.
Figure 10B:
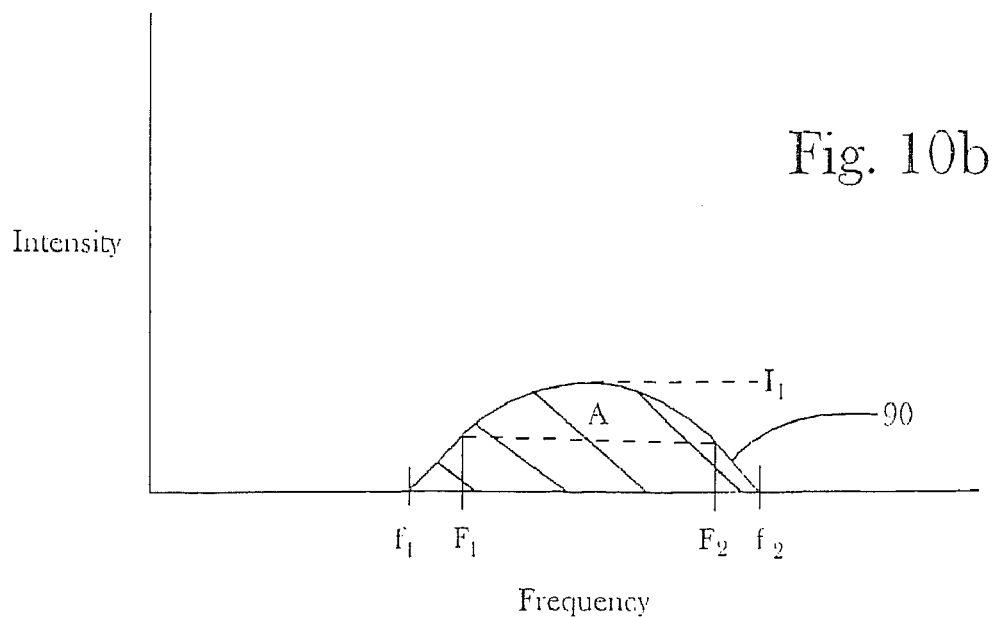

Moreover, rather than utilizing only a monochromatic light source, it is possible that a polychromatic light source could also be utilized. In this regard, when polychromatic light is made to be incident upon a first polarizer, and thereafter upon one or more additional polarizers (e.g., analyzers), in addition to different intensities of light flowing through the analyzer(s), a spreading of different colors over a particular frequency or wavelength range will also occur. Specifically, as shown in FIGS. 10a and 10b, when using polychromatic light, a curve 90 representing a spectrum of frequencies ranging from $f_1$ to $f_2$ of various intensities results in the formation of a somewhat continuous curve of varying light intensities over a particular frequency or wavelength range. The use of a polychromatic source can therefore result in secondary indicia for determining the value assigned to stored bits of data (e.g., a "0" or a "1") and thus enhances data storage. For example, not only could the highest intensity of light $I_1$ be recorded/detected, but also the starting and/or ending points $f_1$ and/or $f_2$ which correspond to the lowest frequency of light being detected, and the highest frequency of light being detected, respectively. Alternatively, the area "A" under each curve could also be compared as, for example, with integral area denoted as power spectral density. Further, the FWHM (i.e., full width half max) can be used as an indicia, representing the frequency range, $f_1$ to $f_2$ at half the maximal intensity. A range of full widths at varying intensities (i.e., 100% maximal, 1% minimal, 50% half maximal, 75% three-fourths maximal, etc.) can also be used. In other words, more than one piece of information can be checked to verify the accuracy of each data point that is stored and read. The presence of more than a single piece of in formation can result in more accurate reading of data and thus result in signal/noise improvements.

Figure 6:
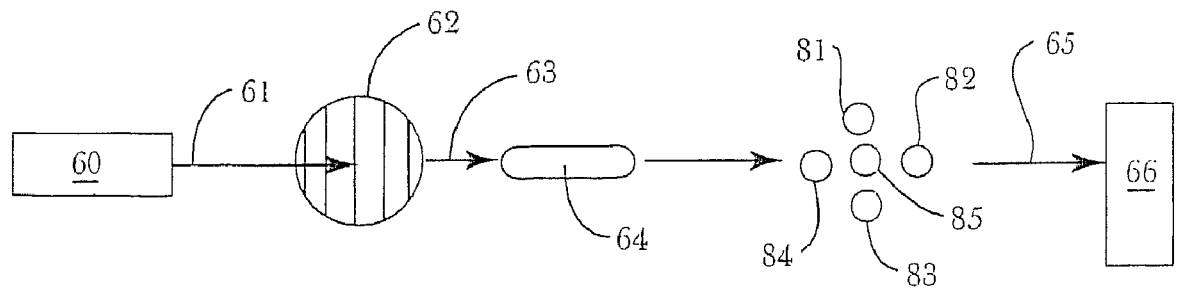
FIG. 6 is a schematic of a means for recording optical information in accordance with the teachings of the present invention.

FIG. 6 shows a light source 60 which emits unpolarized light 61 into a polarizing filter 62 which creates a polarized light beam 63. The polarized light 63 is incident upon a suitable light modulator 64 which causes the light beam 63 from the polarizing filter 62 to be directed to one of a plurality of different polarizing (or analyzing) filters 81, 82, 83, 84 and 85. The modulator 64 is known in the art and can function at frequencies of about 1 GHz and is thus compatible with most computer processing systems. While only five analyzing filters 81-85 are shown, the number of filters that can be used in accordance with this embodiment is based on the data coding system in which it is desired to work. This particular system which utilizes five filters 81-85 is a base-5 system. When the modulator 64 directs the polarized light beam 63 from the polarizing filter 62 to the different analyzing filters 81-85, the result will be different intensities of light 65 being transmitted through each of the different analyzing filters 81-85 onto (or into) a suitable optical recording medium 66. Specifically, each of the polarizing filters 81-85 are fixedly rotated a different amount relative to the polarizing direction of the light beam 63 emanating from the polarizing filter 62. Once the light 65 has been transmitted through one of the different polarizing filters 81-85, the light can then be suitably focused and/or redirected by appropriate optical and/or magneto-optical or acousto-optical (not shown in tins FIG. 6) means onto or into the recording medium 66. Examples of suitable optical recording mediums include: inorganic photochromic crystals, photorefractive materials, chalcogenide semiconductors, organic and polymer materials, thermoplastic media, reversible recording in Tellerium compounds, photothermal recording in Antimony compounds, magneto-optic recording and light stimulated recombination luminescence.

Figure 7:
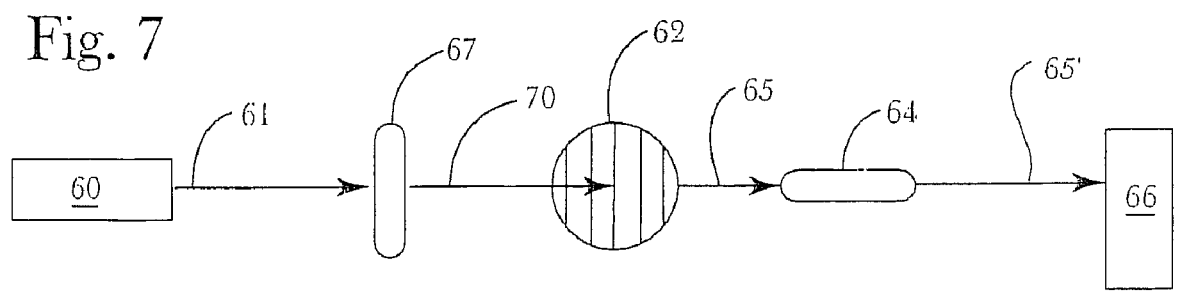
FIG. 7 is a schematic of a means for recording optical information in accordance with the teachings of the present invention.

With regard to FIG. 7, an alternative to the embodiment of FIG. 6 is shown. In this embodiment, the plurality of polarizing filters 81-85 are replaced with a polarization modulator 67. In particular, the polarization modulator 67 can be made of a suitable material such as a silica glass or an X-cut lithium niobate crystal (see, for example, the disclosure in U.S. Pat. No. 6,134,432 for suitable materials). Voltages are applied to electrodes on the modulator 67 to produce an electric field that can orient the polarization of the propagating wave in any suitable direction. This technique provides a very robust and mechanically stable method of polarization control. The polarization of the light wave 70 (as well as the light wave 65) will be maintained through appropriate transmission of the light wave through other non-polarizing optics. The modulator 67 has been shown to have transmission rates of over 500 Mbits/second. A polarizing filter 62, oriented in a fixed direction, then provides an output 65 of varying intensities to a light modulator 64. The light modulator 64 then appropriately directs the output 65' to a similar suitable recording medium 66.

Figure 8:
FIG. 8 is a schematic of a means for recording optical information in accordance with the teachings of the present invention.

FIG. 8 shows another embodiment of the invention wherein a light source 60 emits unpolarized light 61 into an acousto-optic Bragg modulator 68. The acousto-optic Bragg modulator 68 has inputted into it different electrical driving signals which result in different intensities of light 65'' being emitted therefrom. The different intensities of light can then be suitably focused and/or redirected by appropriate optical and/or magneto-optical and/or acousto-optical means into or onto an appropriate recording medium 66.

Figure 9:
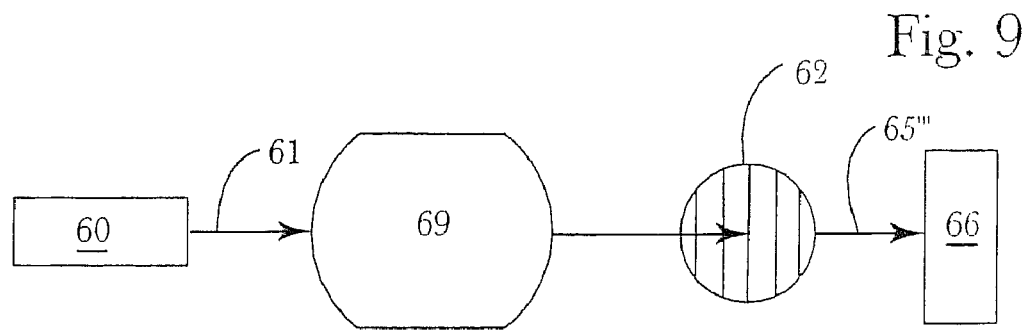
FIG. 9 is a schematic of a means for recording optical information in accordance with the teachings of the present invention.

FIG. 9 shows another embodiment similar to that embodiment shown in FIG. 7, except that the polarization modulator 67, has been replaced with at least one liquid crystal cell. In this regard, depending upon what voltages are applied to the liquid crystal cell 69 (the output which is directed into a polarizing filter 62) will result in a variable intensity output 65'''. The output 65''' can thereafter be suitably directed to an appropriate optical storage medium 66 by any of the means for directing (not sown in FIG. 9) the output 65''', as discussed above herein.

Figure 27:
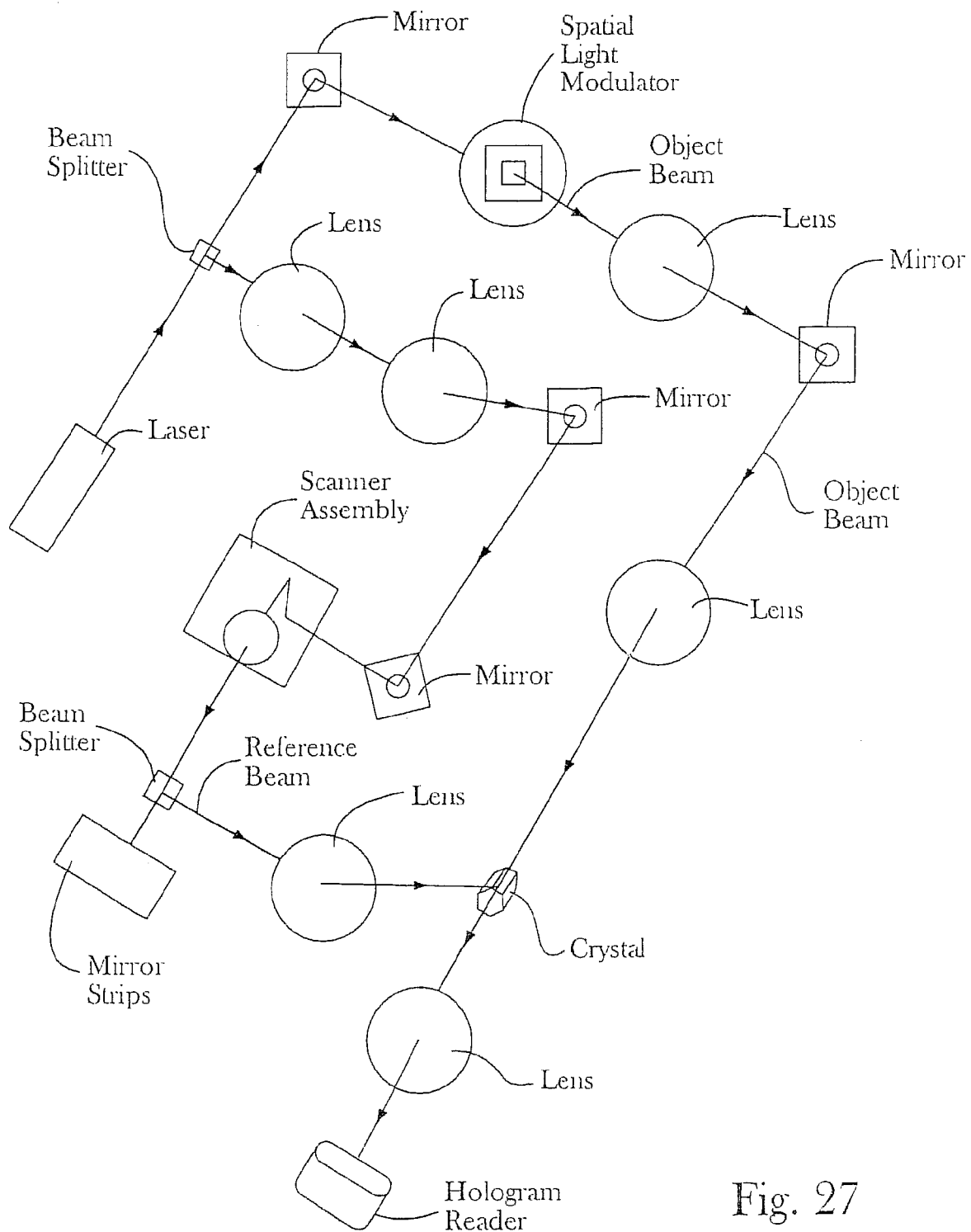
FIG. 27 shows an optical layout of a typical holographic memory system that can be used according to the present invention.

It should be also be clear to an artisan of ordinary skill that the same general technique disclosed herein can be utilized for the optical layout that is shown in FIG. 27. In this regard, FIG. 27 shows a holographic memory system of how a crystal can be imprinted with pages of data. In this regard, similar to the techniques shown in FIGS. 4a-e, the system would work just as well for a holographic memory system.

Optical Examples

The following experiments were performed to show that various light intensities can be recorded by rotating at least two polarizable filters (e.g., a polarizer and an analyzer) relative to each other and recording the different resultant intensities on ordinary photographic film (i.e., color slide film). The recorded intensities were thereafter interrogated with an optical spectrometer by passing a light source through the recorded intensities on the slides and into a probe connected to the optical spectrometer.

All optical recording and interrogation steps were performed on a Newport optics table having one (1) inch grids thereon. In particular, mounting holes were provided at each corner of one inch squares for rigidly securing all optical equipment thereto to minimize data distortion due to vibrations. Different optical data values were obtained and recorded by using varying amounts of light which were caused to be incident on a Canon EOS Rebel 4 camera with zoom lens, which was rigidly mounted to the optics table, in particular, the camera was operated in a manual mode and the manual focus and was set to 50 mm. The film used in the camera was ordinary color slide film known as Fujichrome Color Slide film RH-400 speed.

Figure 20:
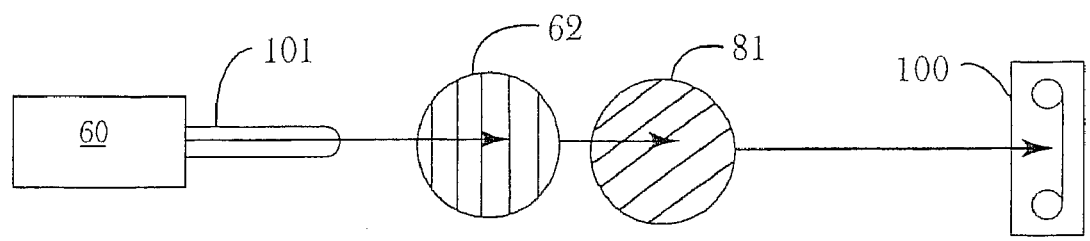
FIG. 20 is a schematic of a means for recording optical information in accordance with one example of the present invention.
Figure 21:
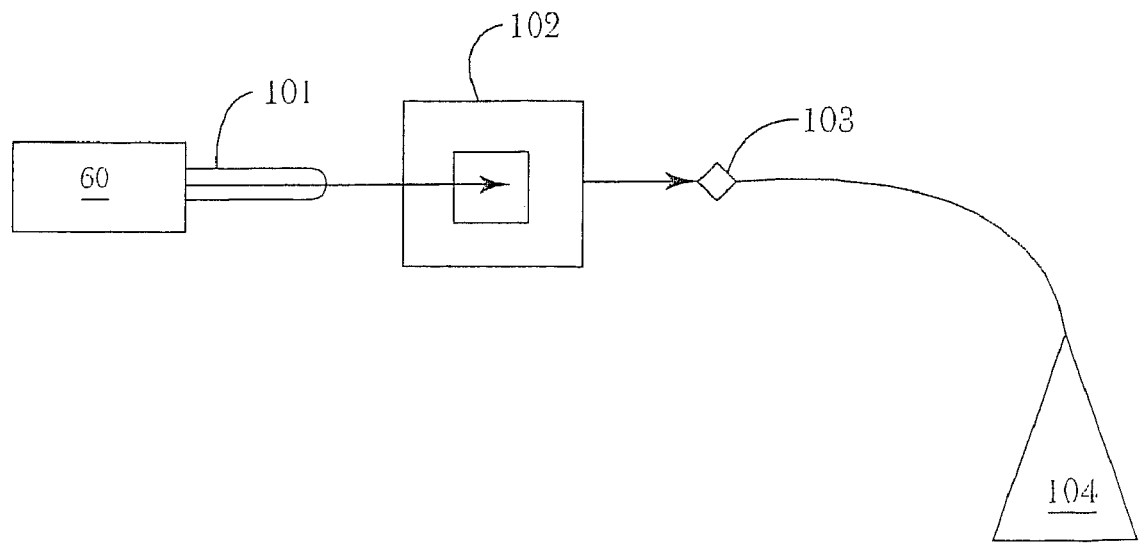
FIG. 21 is a schematic of a means for reading recorded optical information in accordance with, an example of the present invention.

The source of light for all optic experiments was a Stocker and Yale, Model 20 Imagelite, polychromatic light source. The fiberoptic bundle end of the light source was also rigidly mounted to the optics table, with its end being located about 3 cm from a rigidly mounted polarizer/analyzer filter set (Orion Variable Polarizing Filter Set #5558). In particular, as shown in FIGS. 20 and 21, the polychromatic light source 60 was caused to communicate with a polarizing filter set 62 and 81 through a fiber optic bundle 101 (i.e., a Stocker-Yale SF 38036P single S/O; ⅜" bundle, 36" long, MTL-PVC over metal hose). The function of the fiber optic bundle 101 was to transport polychromatic light from the Imagelite light source 60 (which was operating at a setting of "4") to the polarizing filter set 62 and 81. The polarizing filter set 62 and 81 was located at a distance of about 3.3 cm from the lens of the Canon camera 100.

Light from the light source 60 was directed through the fiber optic bundle 101 and caused to be made incident upon the polarizing filter set 62 and 81. The polarizing filter set 62 and 81 was set at six (6) different relative settings which permitted six (6) different intensities of light to be transmitted therethrough. In particular, the polarizing directions of each filter were set at the following relative rotations to each other: 0° relative rotation, 18° relative rotation, 36° relative rotation, 54° relative rotation, 72° relative rotation, and 90° relative rotation. These six (6) different relative rotation filter settings resulted in six (6) different intensities of light being transmitted therethrough. Specifically, the different intensities of polychromatic light were caused to be incident upon the lens of the camera 100 with care being taken so that the fiber optic bundle 101 transmitted light roughly perpendicular into and through the polarizing filter set 62 and 81 and into the lens of the camera 100. The result was a different intensity spot being recorded on each of the six (6) different slides 102 corresponding to each of the six (6) different relative rotation amounts. The differences in each of the slides 102 was readily observable by eye.

Once the different images were recorded onto the photographic film comprising the slides 102, the images or spots were then interrogated by a transmission technique that utilized an optic spectrometer. Specifically, as shown in FIG. 21, data values were retrieved from each of the six (6) different slides 102 by using a StellarNet EPP 2000 spectrometer 104 which utilized Spectra Wiz software. Specifically, the same light source 60 used to create the images on the slides 102 was again connected with the same fiber optic bundle 101, still rigidly mounted on the optics table. Each of the data slides 102 was rigidly mounted in a holder such that the output from the fiber optics bundle 101 was reproducibly and directly incident upon that portion of the slide 102 containing the data or spot, from a distance of about 7.2 cm. Care was taken to assure that the fiber optic bundle 101 was mounted perpendicular to the slides 102 in the slide holder.

A fiber optic probe 103 of the StellarNet EPP 2000 spectrometer 104 was rigidly mounted on the other side of each slide 102 about 7.0 cm away, so that transmission information could be obtained. Again, care was taken to assure proper alignment so that transmission data would not be skewed. The relevant settings on the StellarNet EPP 2000 fiber optic spectrometer were as follows:

| Mode | Scope |
| --- | --- |
| Detector integration time | 4 ms |
| Number of scans to average | 5 |
| Pixel resolution via smoothing | 0 level |
| Temperature compensation | On |
| Spectrometer channels | 1 |
| X axis | Wavelength (nm) |
| Y axis | Counts |

The image light source was then set at a standard setting of "7", in order to obtain information. The EPP 2000 provided information regarding the maximum integral area under the curve (power spectral density, i.e., Counts$^2$) and full width half max ("FWHM") of the peak (in nm) for each slide via the automated Area-PSD function. It is noted that each slide corresponded to the six (6) different rotatable filter settings. Measurements were reliably reproducible.

Figure 22A:
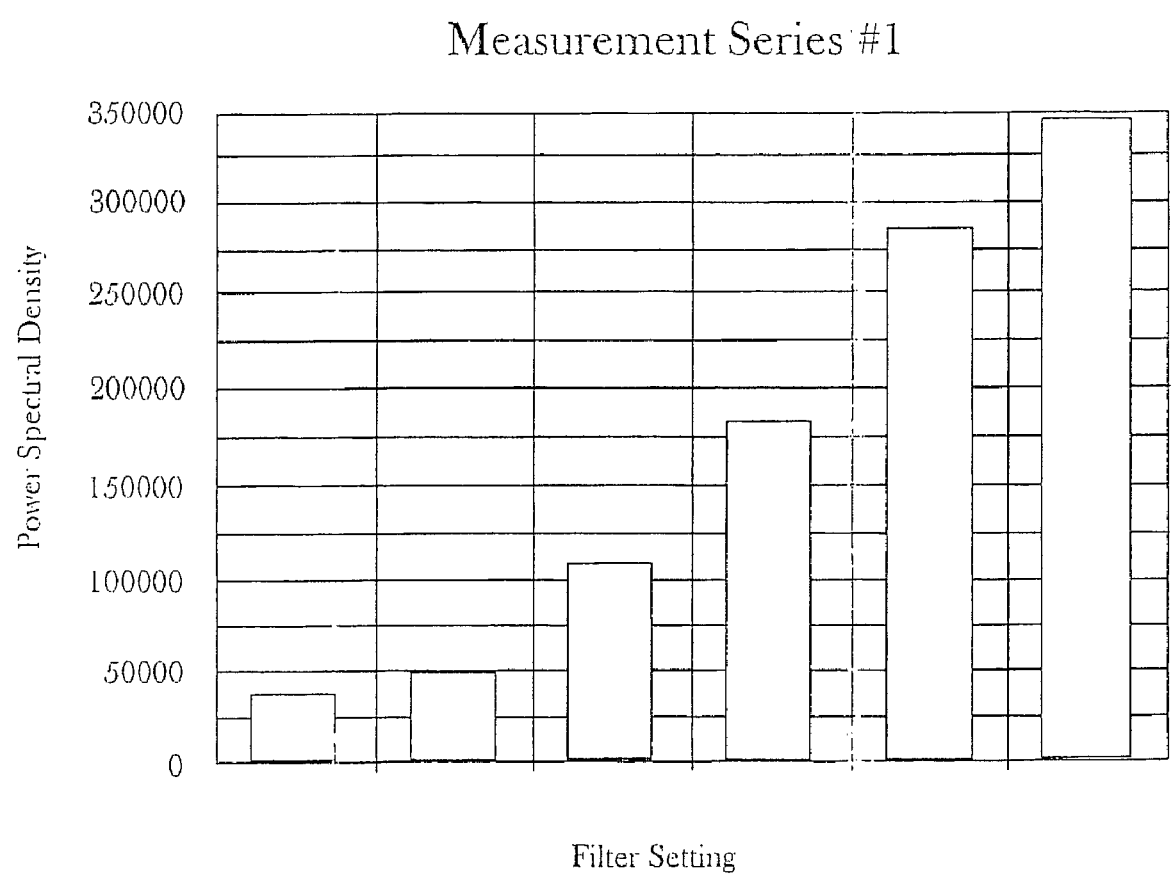
FIGS. 22a, 22b and 22c show in graphic form plots of power spectral density (i.e., intensify) for six (6) different polarizing filter settings.
Figure 22B:
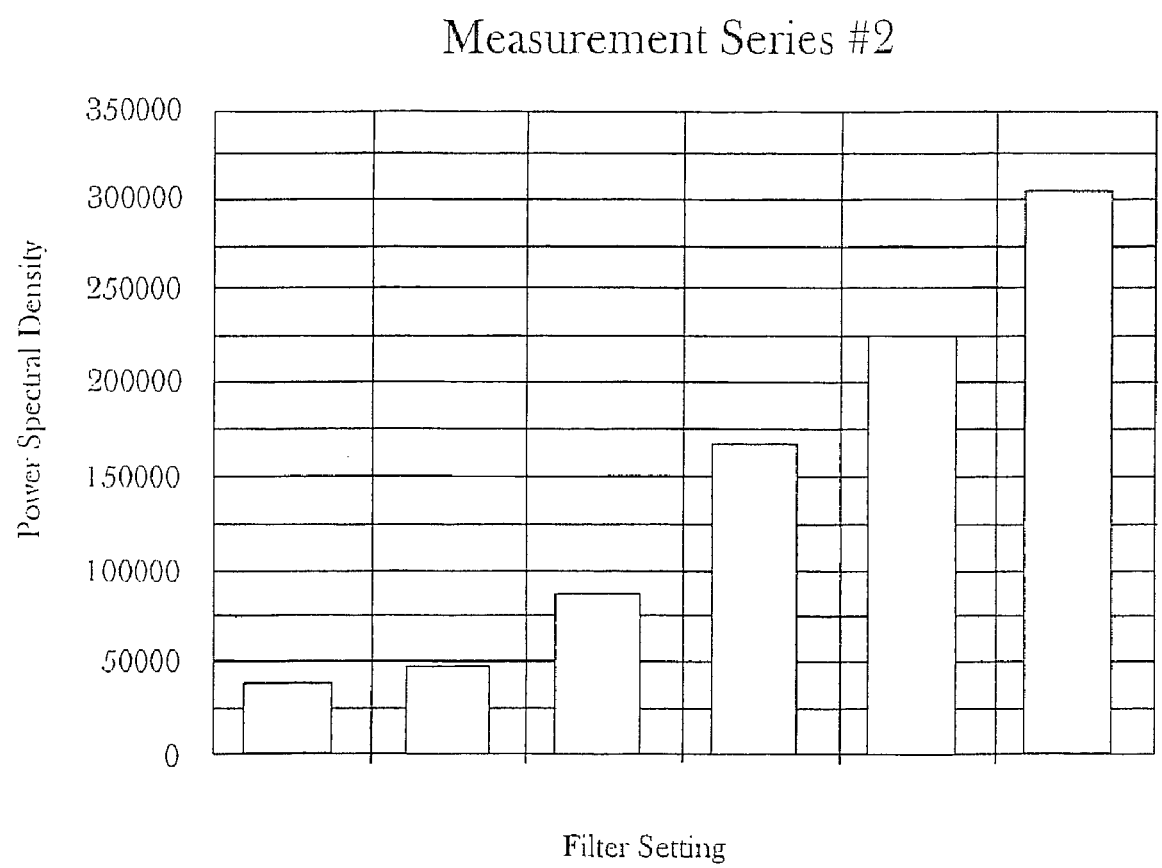
Figure 22C:
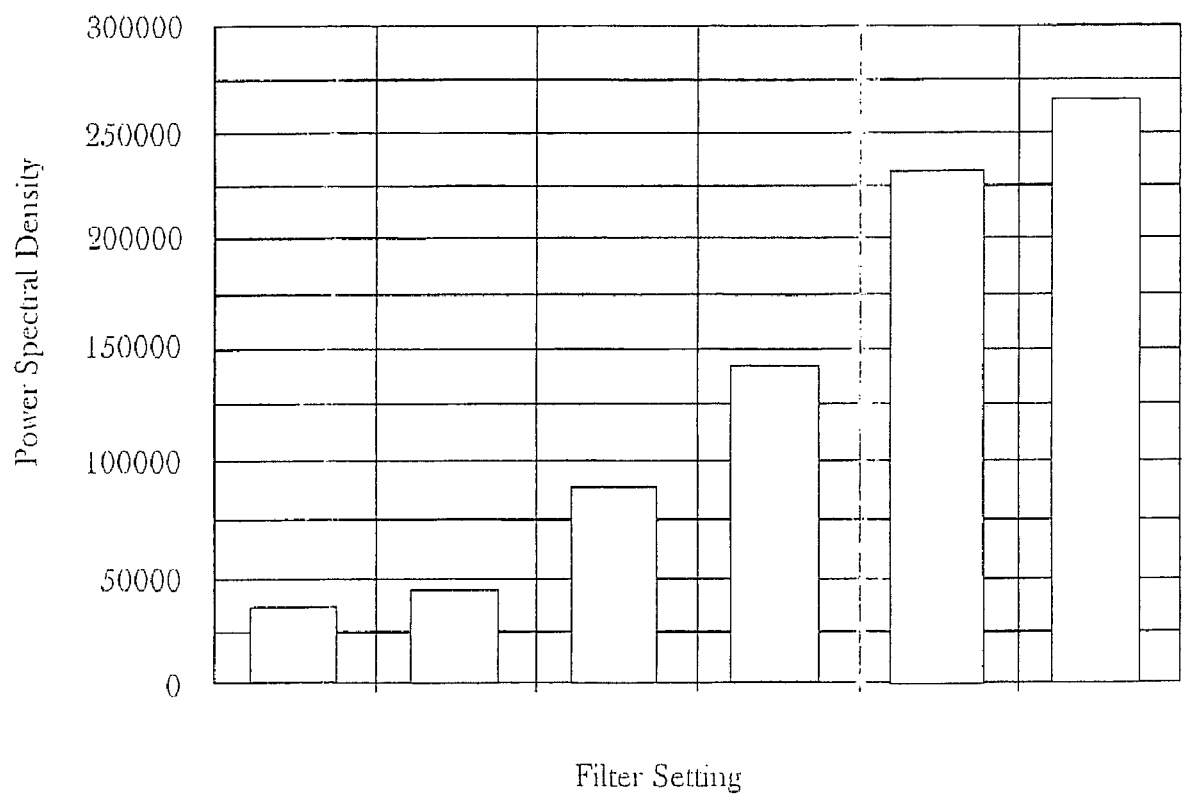
Figure 23:
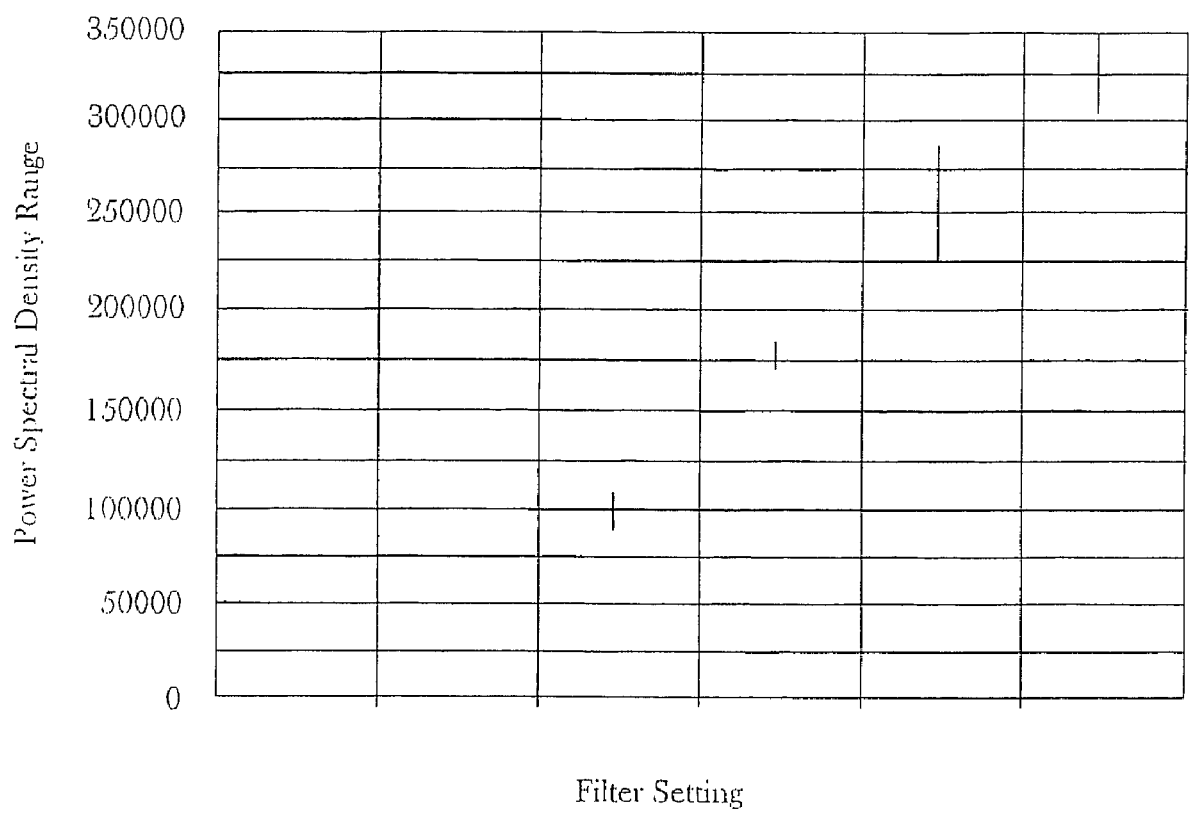
FIG. 23 shows a graph of upper and lower intensity limit deviations corresponding to the six (6) different filter settings of FIGS. 22a-22c.

Measurements of the six (6) slides, corresponding to the six (6) filter positions ranged, in power spectral densities, from 347,690 at 0° to 36,674 at 90°. FWHM ranged from 466 nm at 0° to 160 nm at 90°. Using either power spectral density alone, FWHM alone, or both in combination, six (6) different and distinct data values were obtained. Specifically, as shown in FIGS. 22a, 22b and 22c, three sets of measurements were taken at different times from the same aforementioned six (6) slides. FIGS. 22a-22c are a plot of Power Spectral Density (i.e., intensity) versus the six. (6) different filter settings. The deviation in the upper and/lower limits of the data in FIGS. 22a-22c is superimposed on FIG. 23. It is clear from FIG. 23 that the upper and lower intensity limit deviations corresponding to each of the six (6) different filter settings do not overlap with each other. Thus, this technique shows that intensity alone can provide a basis for a base-6 data storage system.

Figure 24A:
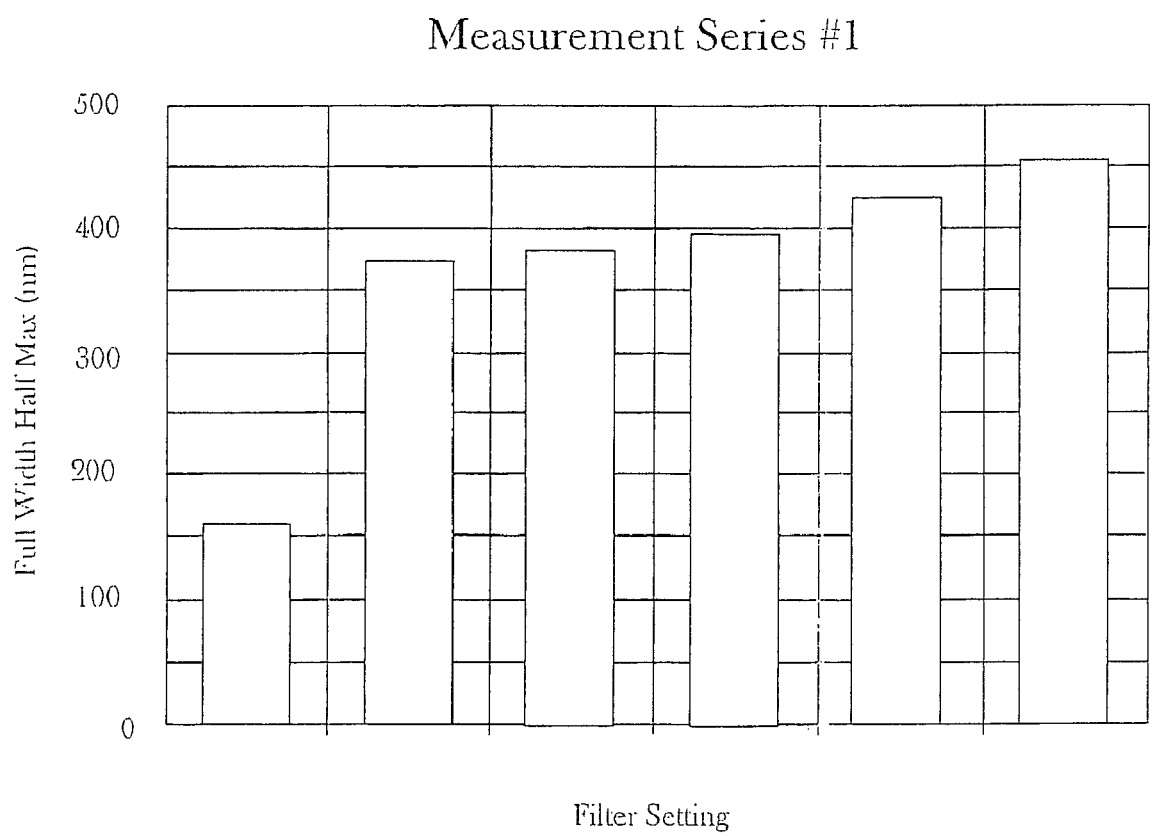
FIGS. 24a, 24b and 24c show in graphic form plots of full width half max (FWHM) data points versus six (6) different polarizing filter settings.
Figure 24B:
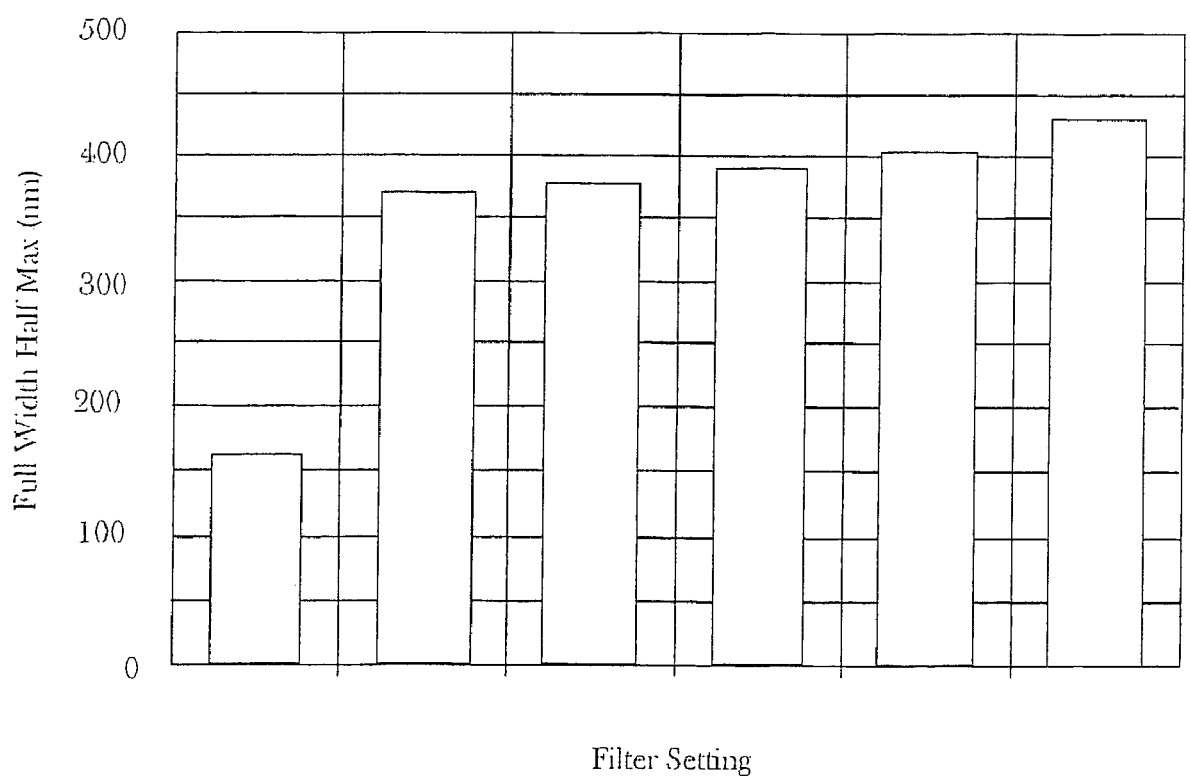
Figure 24C:
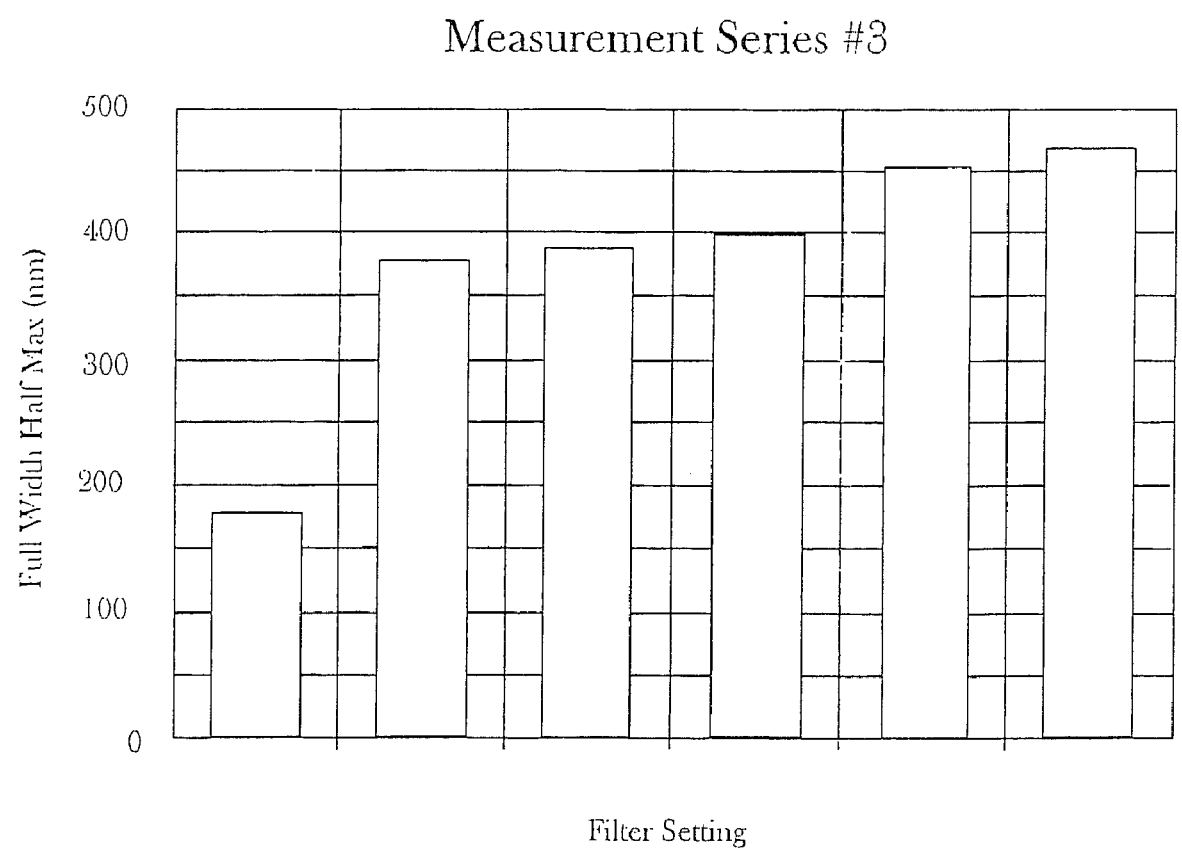
Figure 25:
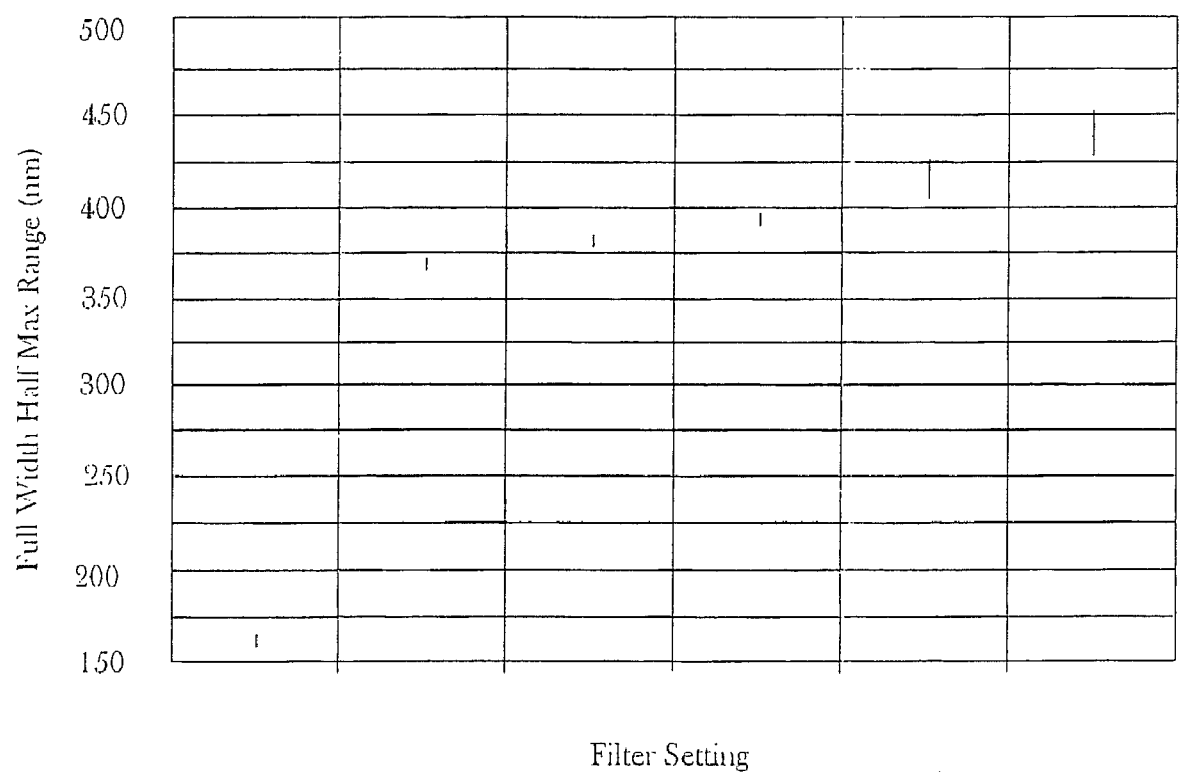
FIG. 25 shows in graphic form the deviation in upper and lower limits for the data shown in FIGS. 24a-24c.

Further, optical transmission data from the six (6) slides was analyzed by a second approach. Specifically, FIGS. 24a, 24b and 24c show plots of full width half max (FWHM) data points versus the six (6) different filter settings. Similar to the data in FIGS. 22a-22c, these data were obtained at three (3) different times to assure the accuracy of the measurements. FIG. 25 shows the deviation in upper and lower limits for the data shown in FIGS. 24a-24c. It is clear from FIG. 25 that the upper limit deviation values for FWHM corresponding to each filter setting do not overlap. Thus, this technique provides another method for data recognition in, for example, a higher order system.

Magnetic Splitting/Shifting Examples

The following magnetic experiments were performed to show that different amounts of Zeeman splitting/shifting can be achieved in a magnetic material and/or a contiguous material. Specifically, varying magnetic field strengths were applied to a contiguous material comprising aluminum foil to simulate one potential configuration of magnetic storage media exhibiting desirable Zeeman splitting/shifting effects.

The source of the magnetic fields utilized were three (3) permanent magnets of different field strengths. In particular, the magnets were obtained from DuraMag, Inc., and were characterized as follows:

Magnet A: (Low Field Strength) NS-10010050, Neodymium-Iron-Boron Magnet, 1.000"×1.000"×0.500" thick with a field strength near the center thereof of about 5,090 G, increasing to about 8,380 G at the edge;

Magnet B: (Intermediate Field Strength) ND-4514 Neodymium Magnet, 1.0"×1.0"×1.0" thick with a field strength near the center thereof of about 8,730 G, increasing to about 10,300 G at the edge; and Magnet C: (High Field Strength) ND-4514 Neodymium Magnet, 1"×1"×1.9" thick with a field strength, near the center thereof of about 11,500 G, increasing to about 11,900 G at the edge.

All spectroscopy measurements were performed using a Hewlett-Packard microwave spectroscopy system (30-minute warm-up). The following are the salient features of the spectroscopy system used in these examples.

(1) HP Display Processor—Ref 0,0 dB, $S_{11}$ mode, log MAG display, 10.0 dB/and marker pips with frequency and dB readout.

(2) HP 8510B Network Analyzer—Ch 1.

(3) HP 8513A Reflection/Transmission Test Set—45 MHz—26.5 GHz. Port 1.

(4) HP 8350B Sweep Oscillator—Instrument State REM, Sweep trigger—INT. Sweep—Time.

(5) HP 83595A RF Plug-in—0.1-26.5 GHz, Power 10.0, mW RF—On, CS Filter—On, ALC—INT.

(6) Cables—W. L. Gore & Associates DAS ATE (55AT) Test cables, 24 inches long.

(7) Waveguides (Maury Microwave, Inc., and Narda, Inc.). It is noted that all waveguides produced flat baselines at 0.0 dB within the various frequency ranges noted below.

a. Narda 616: Range 1.12 to 1.7 GHz b. Maury R229A1: Range 1.7 to 2.6 GHz c. Maury S209C2: Range 2.60 to 3.96 GHz d. Maury G229A1: Range 3.95 to 5.85 GHz e. Maury C209D2: Range 6.85 to 8.2 GHz.

Figure 26:
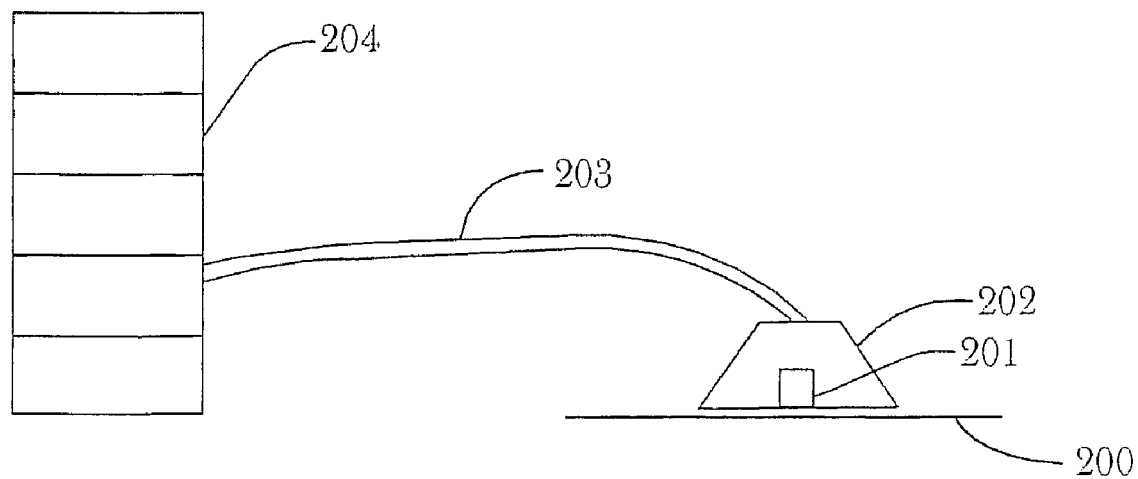
FIG. 26 shows in schematic form the apparatus used to create and determine shifting/splitting frequencies according to the present invention.

FIG. 26 shows a schematic of the basic experimental set-up that was used to determine Zeeman shifting amounts in an aluminum foil contiguous material that was subjected to different magnetic field strengths. A microwave spectrometer 204 was comprised of Hewlett Packard items (1)-(5) described above. The microwave spectrometer 204 was connected by the cable 203 described in item (6) above. Different waveguides 202, described in item (7) above, were placed over each magnet 201 described as Magnets A, B and C above. Each of the magnets 201 (i.e., A, B and C) were sequentially placed into contact with a thin sheet of commonly available aluminum foil 200 (Tamco Distr.), the magnets 201 being oriented with their magnetization direction pointing parallel with the electromagnetic beam propagation in the waveguide 202. The following Table 3 shows the different amounts of Zeeman shifting that were obtained with three (3) different magnetic field strengths generated by the three (3) magnets A, B and C, applied to the contiguous aluminum foil 200. The initial frequency of 1.885 GHz was obtained from the aluminum foil 200 without the application of any magnetic field. The other values correspond to the shifted aluminum foil 200 frequency determined by microwave spectroscopy, as well as the power frequencies in dB.

It is clear from this simple Example that meaningful Zeeman shifting can occur in a contiguous material to which a "permanent" magnetic field has been applied. Accordingly, this Example demonstrates that storage of varying magnetic field strengths can function as a memory storage system and that Zeeman shifting/splitting can function as a memory retrieval system. More particularly, both systems can function in higher order memory systems.

TABLE 3

| Waveguide | No Magnet | Magnet A (Low) | Magnet B (Intermediate) | Magnet C (High) |
| --- | --- | --- | --- | --- |
| 1.12-1.7 GHz | 1.885 GHz, −4.2 dB | 1.855 GHz, −4.6 dB | 1.645 GHz, −7.2 dB | 1.115 GHz, −3.4 dB |
| 1.7-2.6 GHz | - 0 - | - 0 - | - 0 - | - 0 - |
| 2.60-3.95 GHz | - 0 - | - 0 - | - 0 - | - 0 - |
| 3.95-5.85 GHz | - 0 - | - 0 - | - 0 - | - 0 - |

While there has been illustrated and described what is at present considered to be the preferred embodiments of the present invention, it will be understood by those skilled in the art that various changes and modifications maybe made, and equivalents may be substituted for elements thereof without department from the true scope of the invention. In addition, many modifications may be made to adapt the teachings of the invention to a particular situation without departing from the central scope of the invention. Therefore, it is intended that this invention not be limited to the particular embodiments disclosed as the best mode contemplated for carrying out this invention, but that the invention will include all embodiments falling within the scope of the appended claims.

What is claimed is:

1. A method for storing information optically comprising:
providing an optical source;
achieving at least two different optical intensities;
recording said at least two different optical intensities to form at least two recorded optical intensities; and
reading said at least two different recorded optical intensities.

2. A method for storing information optically comprising:
providing an optical source;
achieving at least two different optical wavelengths;
recording said at least two different optical wavelengths to form at least two recorded optical wavelengths; and
reading said at least two different recorded optical wavelengths.

3. The method of claim 1, wherein said optical source comprises at least one of monochromatic and polychromatic light.

4. The method of claim 3, wherein said optical source comprises at least one polarizing filter set comprising at least two movable components.

5. The method of claim 4, wherein said different optical intensities are achieved by rotating said at least two movable components.

6. The method of claim 3, wherein said at least two movable components are rotated relative to each other and when rotated, different optical intensities are achieved.

7. The method of claim 1, wherein said means for recording comprises at least one photosensitive material.

8. The method of claim 1, wherein said at least two different optical intensities comprise a base-2 data storage system.

9. The method of claim 1, wherein said at least two different optical intensities comprise greater than a base-2 data storage system.

10. A data storage apparatus comprising:
an optical source;
a means for achieving at least two different optical intensities;
a means for recording said at least two different optical intensities to form recorded optical intensities; and
a means for reading said at least two different recorded optical intensities.

11. The data storage apparatus of claim 10, wherein said optical source comprises at least one of monochromatic and polychromatic light.

12. The data storage apparatus of claim 10, wherein said optical source comprises at least one polarizing filter set comprising at least two movable components.

13. The data storage apparatus of claim 10, wherein said optical source comprises at least one polarizing filter set comprising at least two movable components.

14. The data storage apparatus of claim 10, wherein said different optical intensities are achieved by rotating said at least two movable components.

15. The data storage apparatus of claim 12, wherein said at least two movable components are rotated relative to each other and when rotated, different optical intensities are achieved.

16. The data storage apparatus of claim 10, wherein said means for recording comprises at least one photosensitive material.

17. The data storage apparatus of claim 10, wherein said at least two different optical intensities comprise a base-2 data storage system.

18. The data storage apparatus of claim 10, wherein said at least two different optical intensities comprise greater than a base-2 data storage system.

* * * * *